US012642062B2

(12) United States Patent
Ueno et al.

(10) Patent No.: US 12,642,062 B2
(45) Date of Patent: May 26, 2026

(54) LIGHT IRRADIATION TYPE HEAT TREATMENT METHOD AND HEAT TREATMENT APPARATUS

(71) Applicant: SCREEN Holdings Co., Ltd., Kyoto (JP)

(72) Inventors: Tomohiro Ueno, Kyoto (JP); Ryo Kishimoto, Kyoto (JP); Kazuhiro Kondo, Kyoto (JP)

(73) Assignee: SCREEN Holdings Co., Ltd., Kyoto (JP)

( * ) Notice: Subject to any disclaimer, the term of this patent is extended or adjusted under 35 U.S.C. 154(b) by 435 days.

(21) Appl. No.: 18/351,267

(22) Filed: Jul. 12, 2023

(65) Prior Publication Data

US 2024/0084411 A1    Mar. 14, 2024

(30) Foreign Application Priority Data

Sep. 14, 2022    (JP) ................................. 2022-145794

(51) Int. Cl.
| | |
|---|---|
| *H10P 95/90* | (2026.01) |
| *G01N 21/88* | (2006.01) |
| *G01N 21/95* | (2006.01) |
| *H04N 23/60* | (2023.01) |
| *H04N 23/73* | (2023.01) |
| *H10P 72/00* | (2026.01) |

(52) U.S. Cl.
CPC ......... *H10P 95/90* (2026.01); *G01N 21/8806* (2013.01); *G01N 21/9505* (2013.01);
(Continued)

(58) Field of Classification Search
CPC ...................... G01N 21/8806; G01N 21/9505; H10P 95/90; H10P 72/0616; G06T 2207/30148; H10F 39/42; H10F 39/199
See application file for complete search history.

(56) References Cited

U.S. PATENT DOCUMENTS

| | | | |
|---|---|---|---|
| 6,285,199 | B1 | 9/2001 | Kim |
| 2012/0012983 | A1 | 1/2012 | Ono et al. |

(Continued)

FOREIGN PATENT DOCUMENTS

| | | |
|---|---|---|
| JP | H11-281580 A | 10/1999 |
| JP | 2002-217109 A | 8/2002 |

(Continued)

OTHER PUBLICATIONS

Bruker Website, Multiple Leading Logic and Foundry Customers Order Bruker X-Ray Defect Inspection Systems, Jul. 11, 2017 at https://www.bruker.com/pt/news-and-events/news/2017/multiple-leading-logic-and-foundry-customers-order-bruker-x-ray-defect-inspection-systems.html (Year: 2017).*

(Continued)

*Primary Examiner* — Scott W Dodds
(74) *Attorney, Agent, or Firm* — OSTROLENK FABER LLP

(57) ABSTRACT

A reflectance measurement part measures the reflectance of a back surface of a semiconductor wafer. An imaging parameter of a camera is adjusted based on the measured reflectance. The imaging parameter includes exposure time and sensitivity of the camera. The camera with the adjusted imaging parameter images the back surface of the semiconductor wafer to determine the presence or absence of a flaw from the obtained image data. The camera is able to perform appropriate imaging in accordance with the reflectance of the back surface of the semiconductor wafer. Thus, a flaw in the back surface of the semiconductor wafer is detected with reliability even if the reflectance of the back surface is varied due to the deposition of a thin film on the back surface.

8 Claims, 10 Drawing Sheets

(52) U.S. Cl.
CPC ........... *H04N 23/64* (2023.01); *H04N 23/665* (2023.01); *H04N 23/73* (2023.01); *H10P 72/0616* (2026.01)

(56) References Cited

U.S. PATENT DOCUMENTS

| | | | | |
|---|---|---|---|---|
| 2013/0171744 A1* | 7/2013 | Kang | .................. | H10P 72/0436 |
| | | | | 438/795 |
| 2018/0254224 A1 | 9/2018 | Kitazawa et al. | | |
| 2020/0196389 A1 | 6/2020 | Ueno et al. | | |
| 2020/0243402 A1 | 7/2020 | Kawarazaki | | |
| 2023/0087029 A1 | 3/2023 | Ueno et al. | | |
| 2024/0011915 A1* | 1/2024 | Kim | ................... | G01N 21/8806 |

FOREIGN PATENT DOCUMENTS

| | | |
|---|---|---|
| JP | 2009-281835 A | 12/2009 |
| JP | 2014-048649 A | 3/2014 |
| JP | 2015-130423 A | 7/2015 |
| JP | 2018-148201 A | 9/2018 |
| JP | 2019-220568 A | 12/2019 |
| JP | 2023-044005 A | 3/2023 |
| KR | 10-1999-0065522 A | 8/1999 |
| KR | 10-2020-0072432 A | 6/2020 |
| TW | 200949237 A | 12/2009 |
| WO | WO 2010/109853 A1 | 9/2010 |

OTHER PUBLICATIONS

Office Action and Search Report dated Mar. 22, 2024 in corresponding Taiwanese Patent Application No. 112126025 and an English machine language translation made from the Japanese translation of the original communication.

Request for the Submission of an Opinion dated Jan. 7, 2025 in corresponding Korean Patent Application No. 10-2023-0115627 and a computer generated English translation obtained from the JPO.

Notice of Reasons for Refusal dated Feb. 3, 2026 in corresponding Japanese Patent Application No. 2022-145794.

* cited by examiner

F I G. 1
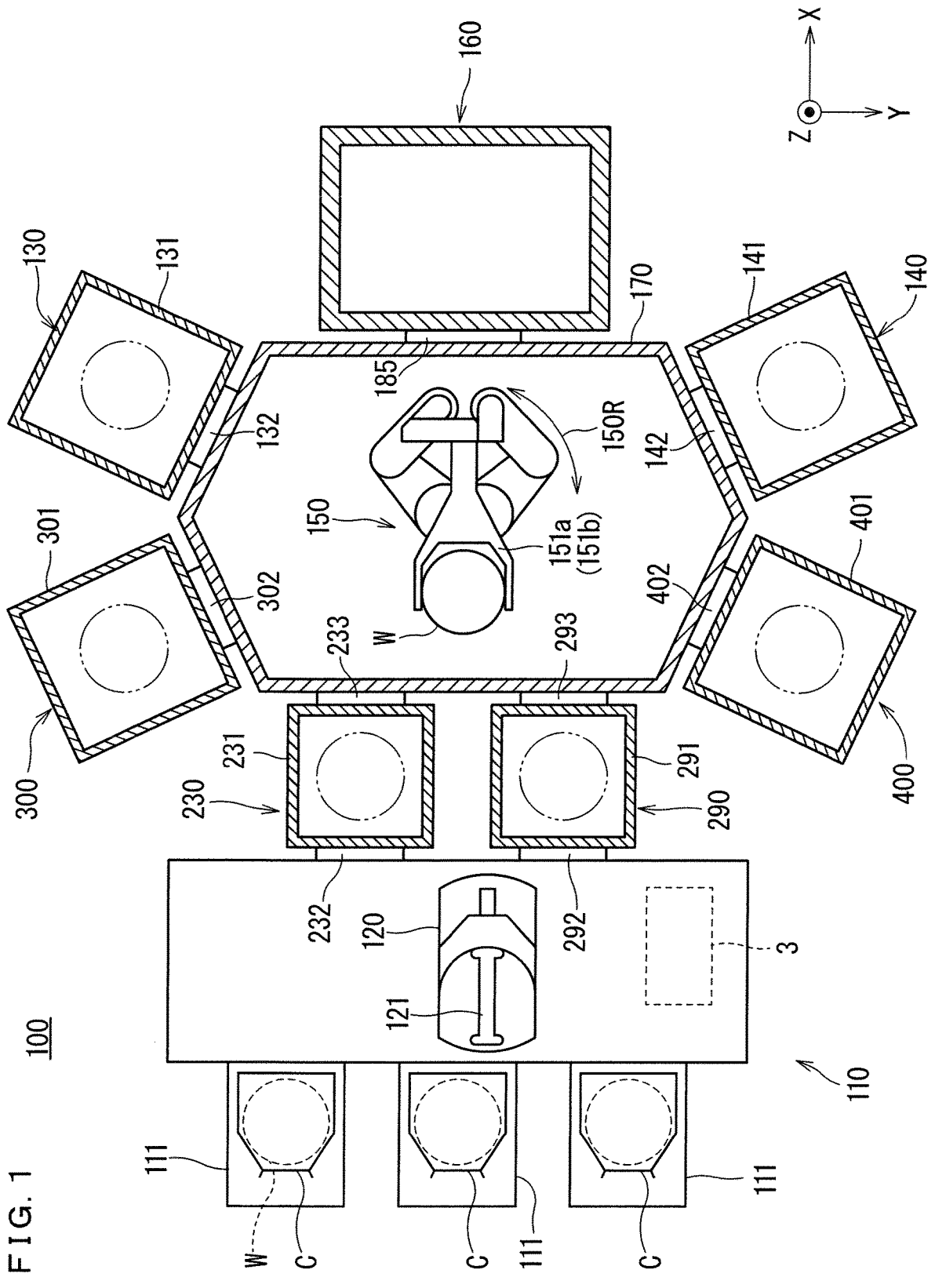

F I G. 6
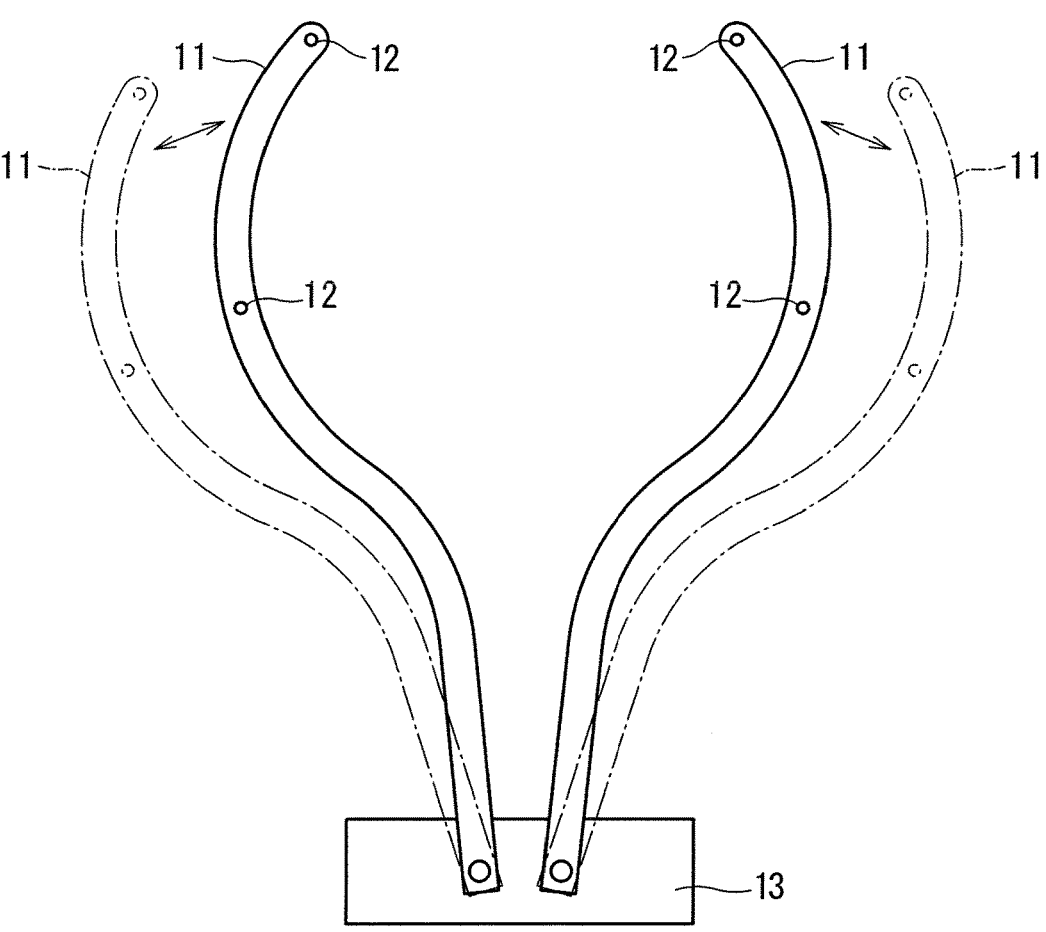
F I G. 7
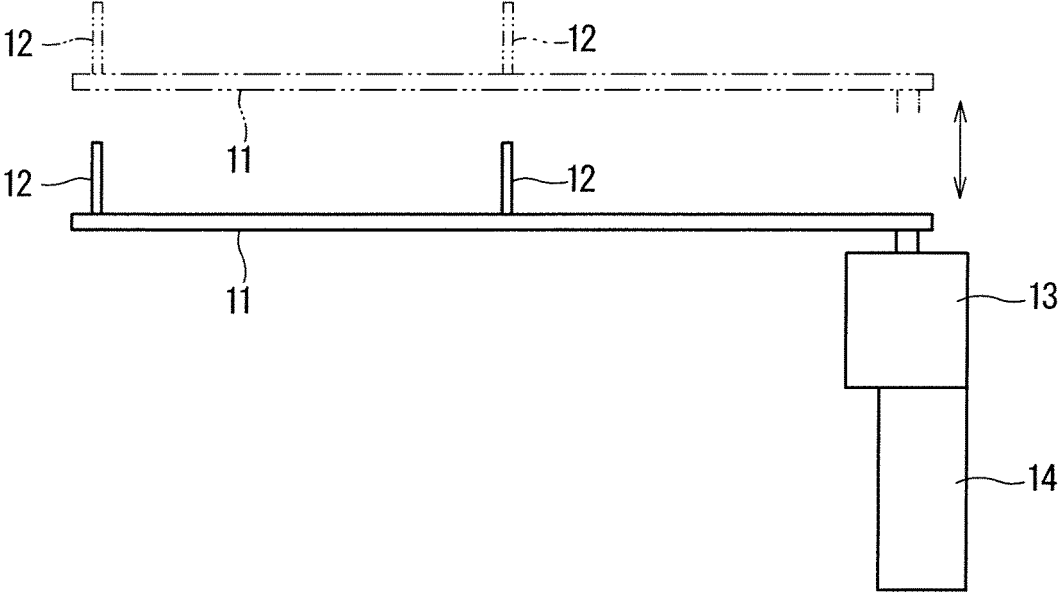

F I G. 8
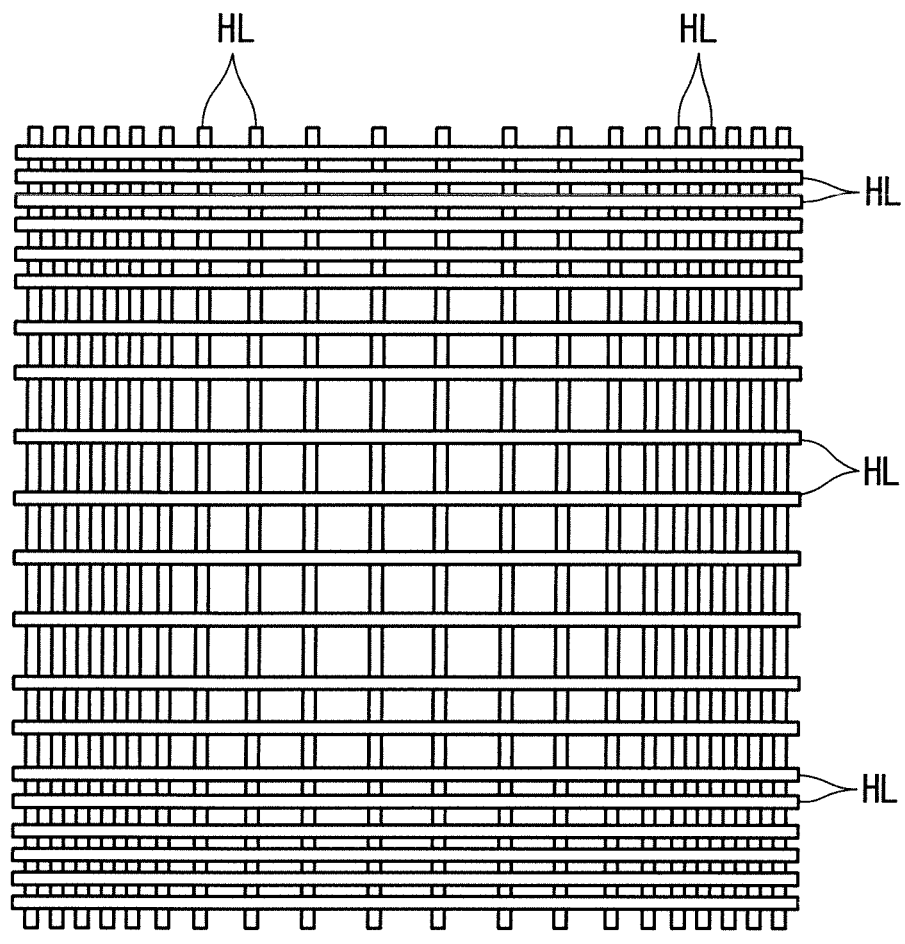

F I G. 1 0
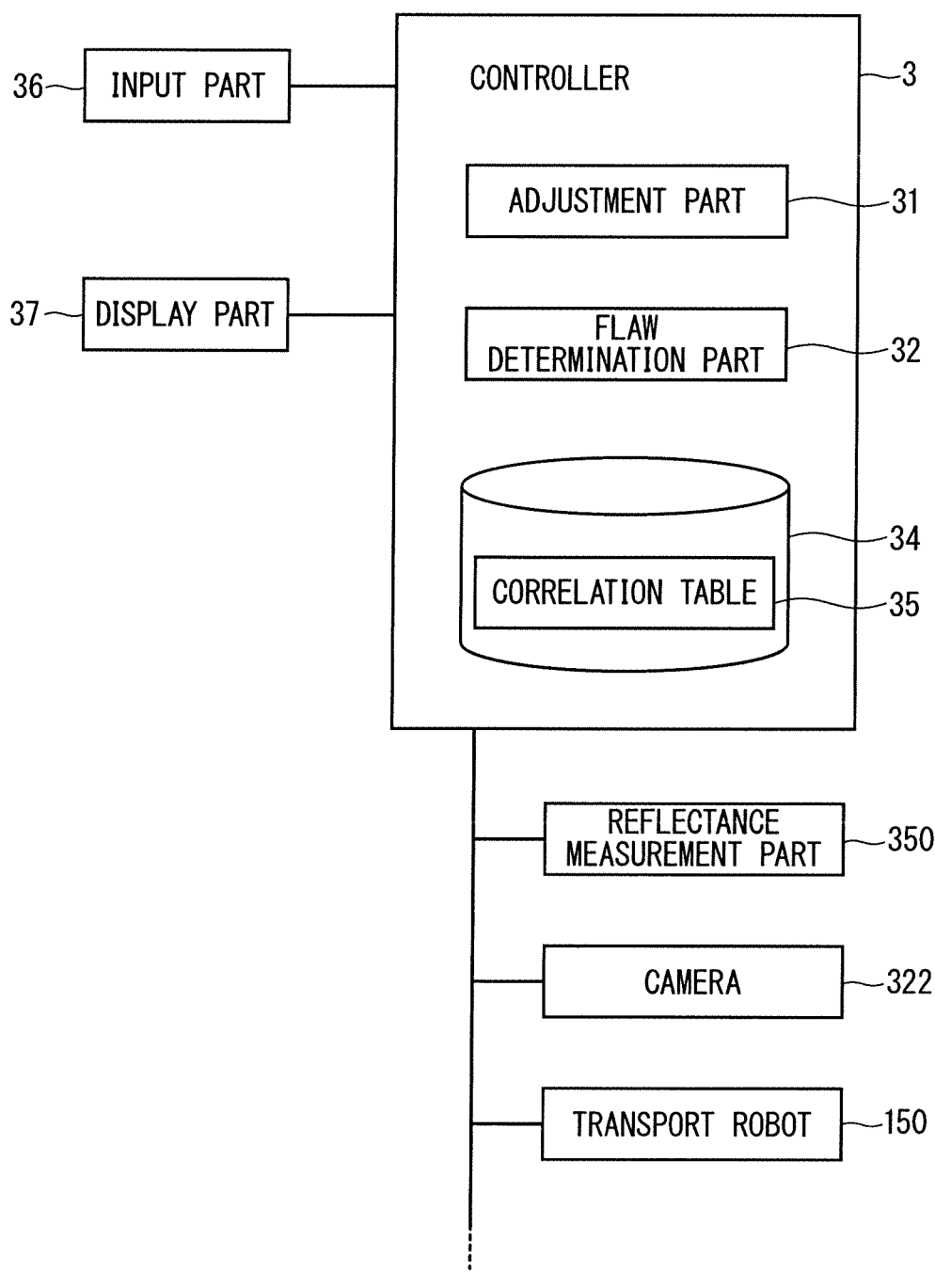

F I G. 11
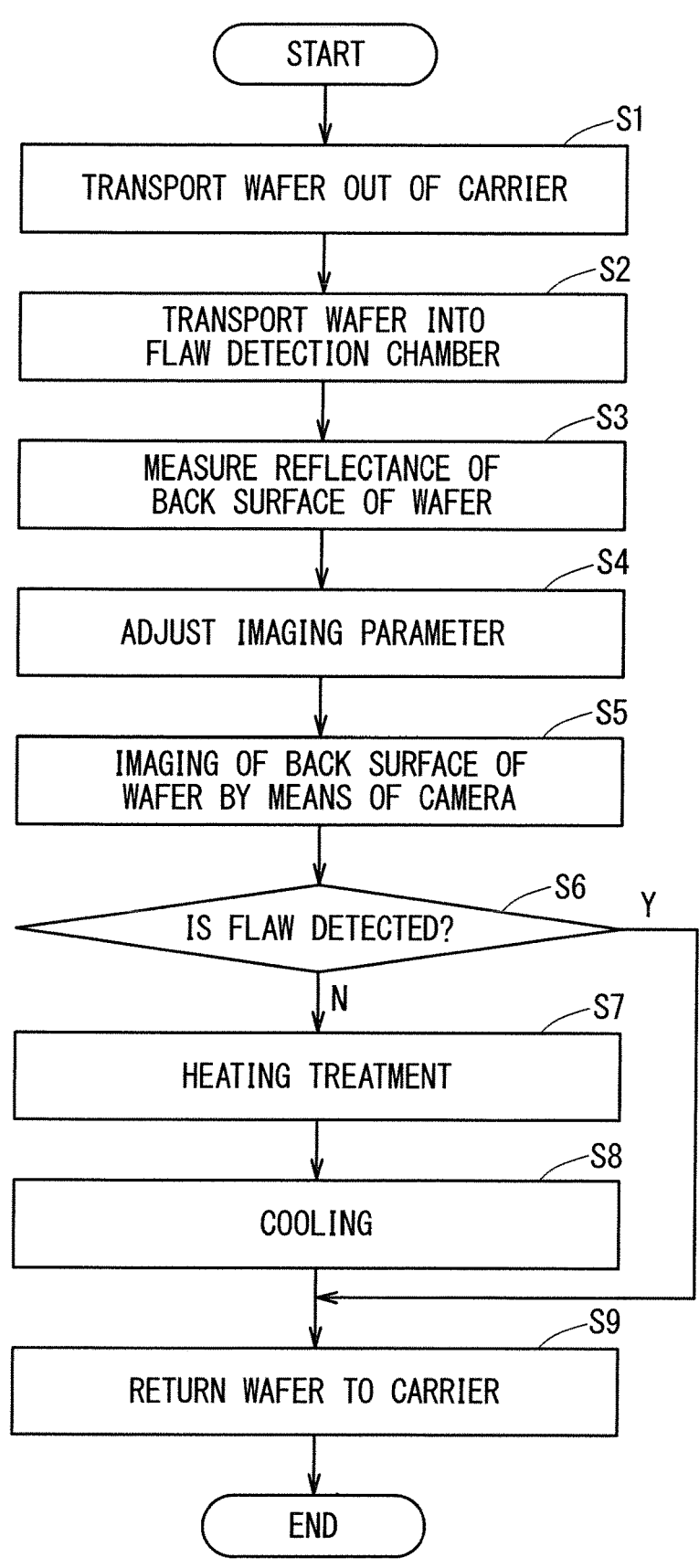

F I G . 12
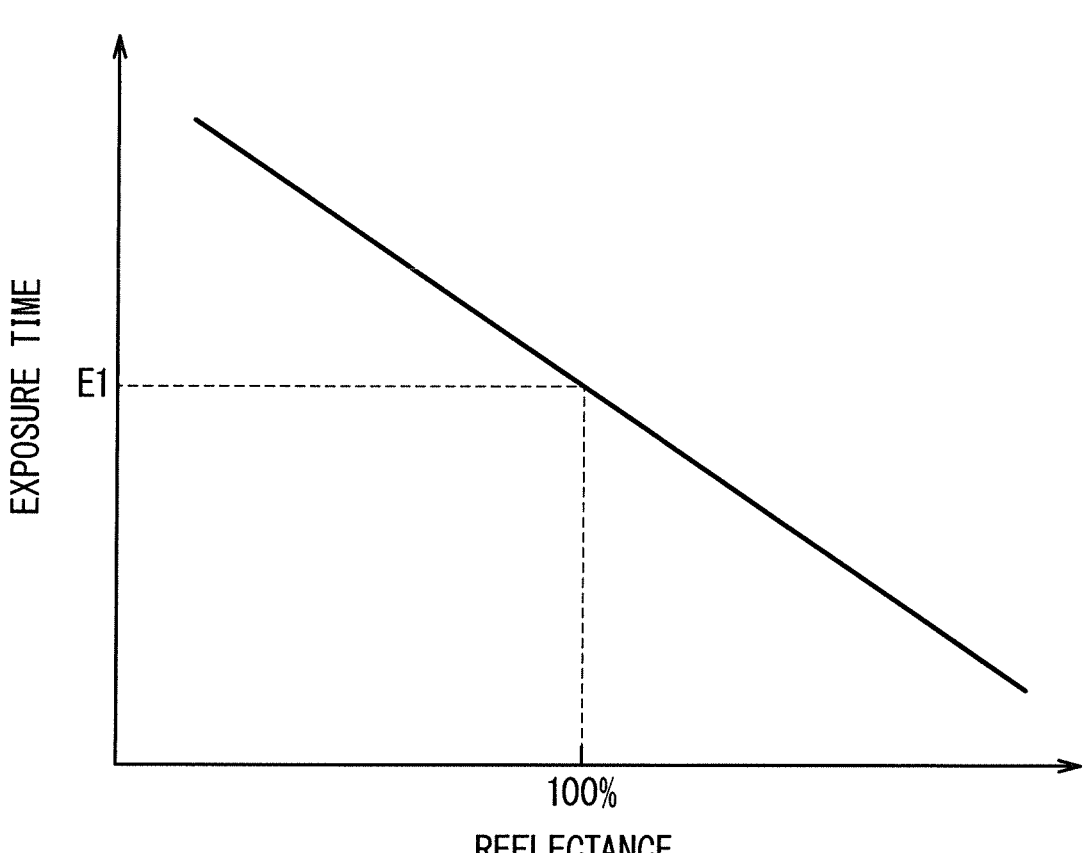

LIGHT IRRADIATION TYPE HEAT TREATMENT METHOD AND HEAT TREATMENT APPARATUS

BACKGROUND OF THE INVENTION

Field of the Invention

The present invention relates to a heat treatment method and a heat treatment apparatus which irradiate a substrate with light to heat the substrate. Examples of the substrate to be treated include a semiconductor wafer, a substrate for a liquid crystal display device, a substrate for a flat panel display (FPD), a substrate for an optical disk, a substrate for a magnetic disk, and a substrate for a solar cell.

Description of the Background Art

In the process of manufacturing a semiconductor device, attention has been given to flash lamp annealing (FLA) which heats a semiconductor wafer in an extremely short time. The flash lamp annealing is a heat treatment technique in which xenon flash lamps (the term "flash lamp" as used hereinafter refers to a "xenon flash lamp") are used to irradiate a surface of a semiconductor wafer with a flash of light, thereby raising the temperature of only the surface of the semiconductor wafer in an extremely short time (several milliseconds or less).

The xenon flash lamps have a spectral distribution of radiation ranging from ultraviolet to near-infrared regions. The wavelength of light emitted from the xenon flash lamps is shorter than that of light emitted from conventional halogen lamps, and approximately coincides with a fundamental absorption band of a silicon semiconductor wafer. Thus, when a semiconductor wafer is irradiated with a flash of light emitted from the xenon flash lamps, the temperature of the semiconductor wafer can be raised rapidly, with only a small amount of light transmitted through the semiconductor wafer. Also, it has turned out that flash irradiation, that is, the irradiation of a semiconductor wafer with a flash of light in an extremely short time of several milliseconds or less allows a selective temperature rise only near the surface of the semiconductor wafer.

Such flash lamp annealing is used for processes that require heating in an extremely short time, e.g. typically for the activation of impurities implanted in a semiconductor wafer. The irradiation of the surface of the semiconductor wafer implanted with impurities by an ion implantation process with a flash of light emitted from the flash lamps allows the temperature rise in the surface of the semiconductor wafer to an activation temperature only for an extremely short time, thereby achieving only the activation of the impurities without deep diffusion of the impurities.

A heat treatment apparatus employing such xenon flash lamps momentarily irradiates a front surface of a semiconductor wafer with a flash of light having ultrahigh energy. In some cases, this abruptly deforms the semiconductor wafer due to thermal stresses to result in wafer cracking. In particular, if there is a flaw in the semiconductor wafer, the semiconductor wafer is easily cracked starting from the flaw. If a semiconductor wafer is cracked during heat treatment, not only the semiconductor wafer becomes defective, but also the cleanup of broken pieces of the semiconductor wafer is required. This results in the long downtime of the apparatus to cause a significant decrease in productivity. To solve such a problem, U.S. Patent Application Publication No. 2018/0254224 discloses a technique for quickly detecting cracks in a semiconductor wafer during the flash irradiation to minimize the decrease in productivity.

For reduction in the frequency of semiconductor wafer cracking during the flash irradiation, it is necessary to detect flaws in semiconductor wafers prior to the flash irradiation and to avoid flash heating for semiconductor wafers having such flaws. In general, flaws that lead to wafer cracking are often found in back surfaces of semiconductor wafers with which transport arms, support pins, and the like frequently come in contact. For this reason, the flash irradiation of semiconductor wafers having flaws is prevented by imaging the back surfaces of semiconductor wafers by means of a camera prior to the flash irradiation and then performing image processing on the acquired image data to detect flaws.

There are cases in which various thin films (oxide films, nitride films, metal layers, and the like) are deposited on the back surfaces of semiconductor wafers in the course of the manufacturing process. The reflectance of the back surfaces of semiconductor wafers varies greatly depending on the type and thickness of the deposited thin films. Due to such variations in reflectance of the back surfaces of semiconductor wafers, there has been a possibility that flaws, if any, in the back surfaces of semiconductor wafers cannot be detected from the result of imaging by means of the camera.

SUMMARY

The present invention is intended for a method of irradiating a substrate with light to heat the substrate.

According to one aspect of the present invention, the method comprises the steps of: (a) measuring the reflectance of a back surface of a substrate; (b) imaging the back surface of the substrate by means of a camera to detect the presence or absence of a flaw in the back surface of the substrate; and (c) irradiating the substrate with light to heat the substrate, wherein an imaging parameter of the camera is adjusted based on the reflectance of the back surface of the substrate measured in the step (a).

The camera is able to perform appropriate imaging in accordance with the reflectance of the back surface of the substrate. Thus, a flaw in the back surface of the substrate is detected with reliability even if the reflectance of the back surface is varied due to the deposition of a thin film on the back surface.

Preferably, the wavelength of light impinging upon the back surface of the substrate in the step (a) is equal to the wavelength of light impinging upon the back surface of the substrate in the step (b).

The imaging parameter of the camera is appropriately adjusted based on the measured reflectance of the back surface of the substrate.

Preferably, the execution of the step (c) on the substrate having a flaw detected in the step (b) is interrupted.

This prevents cracking of the substrate to prevent the reduction in productivity.

The present invention is also intended for a heat treatment apparatus for irradiating a substrate with light to heat the substrate.

According to one aspect of the present invention, the heat treatment apparatus comprises: a treatment chamber for performing heat treatment on a substrate; a light irradiation part for irradiating the substrate received in the treatment chamber with light; a flaw detection chamber for detecting the presence or absence of a flaw in a back surface of the substrate; a camera for imaging the back surface of the substrate received in the flaw detection chamber to detect the presence or absence of a flaw; a reflectance measurement part for measuring the reflectance of the back surface of the substrate; and an adjustment part for adjusting an imaging parameter of the camera, based on the reflectance of the back surface of the substrate measured by the reflectance measurement part.

The camera is able to perform appropriate imaging in accordance with the reflectance of the back surface of the substrate. Thus, a flaw in the back surface of the substrate is detected with reliability even if the reflectance of the back surface is varied due to the deposition of a thin film on the back surface.

Preferably, the wavelength of light impinging upon the back surface of the substrate when the reflectance measurement part measures the reflectance is equal to the wavelength of light impinging upon the back surface of the substrate when the camera performs the imaging.

The imaging parameter of the camera is appropriately adjusted based on the measured reflectance of the back surface of the substrate.

The transport of the substrate having a flaw detected in the flaw detection chamber to the treatment chamber is interrupted.

This prevents cracking of the substrate during the treatment to prevent the reduction in productivity.

It is therefore an object of the present invention to detect a flaw in a back surface of a substrate with reliability even when a thin film is deposited on the back surface of the substrate.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a plan view showing a heat treatment apparatus according to the present invention;

FIG. 6 is a plan view of a transfer mechanism;

FIG. 7 is a side view of the transfer mechanism;

FIG. 8 is a plan view showing an arrangement of halogen lamps;

FIG. 10 is a block diagram showing a configuration of a controller;

FIG. 11 is a flow diagram showing a procedure for a processing operation in the heat treatment apparatus of FIG. 1; and FIG. 12 is a graph showing an example of a correlation table.

DESCRIPTION OF THE PREFERRED EMBODIMENTS

Figure 2:
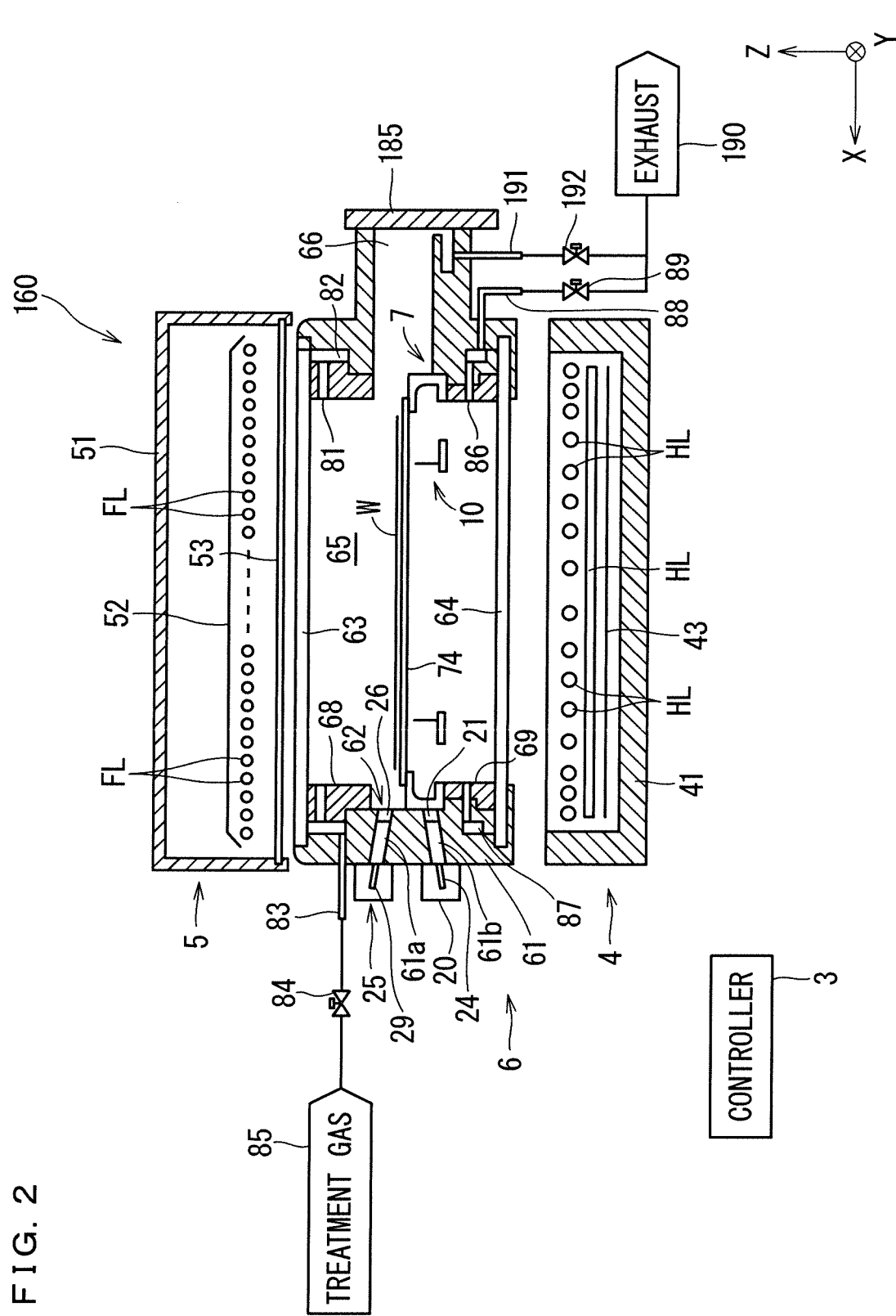
FIG. 2 is a longitudinal sectional view showing a configuration of a heat treatment part.

A preferred embodiment according to the present invention will now be described in detail with reference to the drawings. In the following description, expressions indicating relative or absolute positional relationships (e.g., "in one direction", "along one direction", "parallel", "orthogonal", "center", "concentric", and "coaxial") shall represent not only the exact positional relationships but also a state in which the angle or distance is relatively displaced to the extent that tolerances or similar functions are obtained, unless otherwise specified. Also, expressions indicating equal states (e.g., "identical", "equal", and "homogeneous") shall represent not only a state of quantitative exact equality but also a state in which there are differences that provide tolerances or similar functions, unless otherwise specified. Also, expressions indicating shapes (e.g., "circular", "rectangular", and "cylindrical") shall represent not only the geometrically exact shapes but also shapes to the extent that the same level of effectiveness is obtained, unless otherwise specified, and may have unevenness or chamfers. Also, an expression such as "comprising", "equipped with", "provided with", "including", or "having" a component is not an exclusive expression that excludes the presence of other components. Also, the expression "at least one of A, B, and C" includes "A only", "B only", "C only", "any two of A, B, and C", and "all of A, B, and C".

FIG. 1 is a plan view of a heat treatment apparatus 100 according to the present invention. The heat treatment apparatus 100 is a flash lamp annealer for irradiating a disk-shaped semiconductor wafer W serving as a substrate with flashes of light to heat the semiconductor wafer W. The size of the semiconductor wafer W to be treated is not particularly limited. For example, the semiconductor wafer W to be treated has a diameter of 300 mm and 450 mm. It should be noted that the dimensions of components and the number of components are shown in exaggeration or in simplified form, as appropriate, in FIG. 1 and the subsequent figures for the sake of easier understanding. An XYZ rectangular coordinate system in which an XY plane is defined as a horizontal plane and a Z axis is defined to extend in a vertical direction is additionally shown in FIGS. 1 and 2 for purposes of clarifying the directional relationship therebetween.

The heat treatment apparatus 100 includes: an indexer part 110 for transporting untreated semiconductor wafers W from the outside into the heat treatment apparatus 100 and for transporting treated semiconductor wafers W to the outside of the heat treatment apparatus 100; an alignment part 230 for positioning an untreated semiconductor wafer W; a warpage measurement part 290 for measuring the warpage of a semiconductor wafer W; two cooling parts 130 and 140 each for cooling a semiconductor wafer W subjected to heating treatment; a flaw detection part 300 for detecting the presence or absence of flaws in a back surface of a semiconductor wafer W; a film thickness measurement part 400 for measuring the thickness of a thin film formed on a semiconductor wafer W; and a heat treatment part 160 for performing flash heating treatment on a semiconductor wafer W. The heat treatment apparatus 100 further includes a transport robot 150 for transferring a semiconductor wafer W to and from the cooling parts 130 and 140, the flaw detection part 300, the film thickness measurement part 400, and the heat treatment part 160. The heat treatment apparatus 100 further includes a controller 3 for controlling operating mechanisms provided in the aforementioned processing parts and the transport robot 150 to cause the flash heating treatment of the semiconductor wafer W to proceed.

The indexer part 110 is disposed in an end portion of the heat treatment apparatus 100. The indexer part 110 includes three load ports 111 and a transfer robot 120. The three load ports 111 are arranged in juxtaposition along the Y axis in the end portion of the heat treatment apparatus 100. Each of the load ports 111 is capable of placing a single carrier (or cassette) C thereon. Accordingly, a maximum of three carriers C are placed on the indexer part 110. An unmanned transport vehicle (an AGV (automatic guided vehicle) or an OHT (overhead hoist transfer)) or the like transports a carrier C with untreated semiconductor wafers W stored therein to place the carrier C on the load ports 111. The unmanned transport vehicle also carries a carrier C with treated semiconductor wafers W stored therein away from the load ports 111. A dummy carrier with dummy wafers stored therein may be placed on one of the three load ports 111.

In the load ports 111, the carriers C are movable upwardly and downwardly so that the transfer robot 120 is able to load any semiconductor wafer W into each of the carriers C and unload any semiconductor wafer W from each of the carriers C. The carriers C may be of the following types: an SMIF (standard mechanical interface) pod and an OC (open cassette) which exposes stored semiconductor wafer W to the outside atmosphere, in addition to a FOUP (front opening unified pod) which stores semiconductor wafer W in an enclosed or sealed space.

The transfer robot 120 is configured to be slidable along the Y axis, pivotable about the Z axis, and movable upwardly and downwardly along the Z axis. The transfer robot 120 moves a hand 121 forwardly and backwardly. Thus, the transfer robot 120 loads and unloads semiconductor wafers W into and from the carriers C placed on any load port 111, and transfers semiconductor wafers W to and from the alignment part 230 and the warpage measurement part 290. The operation of the transfer robot 120 loading and unloading the semiconductor wafers W into and from the carriers C is achieved by the sliding movement of the hand 121 and the upward and downward movement of the carriers C. The transfer of the semiconductor wafers W between the transfer robot 120 and the alignment part 230 or between the transfer robot 120 and the warpage measurement part 290 is achieved by the sliding movement of the hand 121 and the upward and downward movement of the transfer robot 120.

The alignment part 230 and the warpage measurement part 290 are provided between the indexer part 110 and a transport chamber 170 so as to connect the indexer part 110 and the transport chamber 170. The alignment part 230 is a processing part for rotating a semiconductor wafer W in a horizontal plane to an orientation appropriate for flash heating. The alignment part 230 includes an alignment chamber 231 which is a housing made of an aluminum alloy, a mechanism provided in the alignment chamber 231 and for supporting and rotating a semiconductor wafer W in a horizontal attitude, a mechanism provided in the alignment chamber 231 and for optically detecting a notch, an orientation flat, and the like formed in a peripheral portion of a semiconductor wafer W, and the like.

A gate valve 232 is provided in a connector portion between the alignment chamber 231 and the indexer part 110. An opening for communication between the alignment chamber 231 and the indexer part 110 is openable and closable by the gate valve 232. A gate valve 233 is provided in a connector portion between the alignment chamber 231 and the transport chamber 170. An opening for communication between the alignment chamber 231 and the transport chamber 170 is openable and closable by the gate valve 233. In other words, the alignment chamber 231 and the indexer part 110 are connected to each other via the gate valve 232, and the alignment chamber 231 and the transport chamber 170 are connected to each other via the gate valve 233.

The gate valve 232 is opened when a semiconductor wafer W is transferred between the indexer part 110 and the alignment chamber 231. The gate valve 233 is opened when a semiconductor wafer W is transferred between the alignment chamber 231 and the transport chamber 170. When the gate valve 232 and the gate valve 233 are closed, the interior of the alignment chamber 231 is an enclosed space.

The alignment part 230 rotates the semiconductor wafer W received from the transport robot 120 of the indexer part 110 about a vertical axis passing through the central portion of the semiconductor wafer W to optically detect a notch and the like, thereby adjusting the orientation of the semiconductor wafer W. The semiconductor wafer W subjected to the orientation adjustment is taken out of the alignment part 230 by the transport robot 150.

The warpage measurement part 290 is a processing part for measuring the warpage of a semiconductor wafer W subjected to the heating treatment. The warpage measurement part 290 includes a warpage measurement chamber 291 which is a housing made of an aluminum alloy, a mechanism provided in the warpage measurement chamber 291 and for holding a semiconductor wafer W, a mechanism provided in the warpage measurement chamber 291 and for optically detecting the warpage of a semiconductor wafer W, and the like.

A gate valve 292 is provided in a connector portion between the warpage measurement chamber 291 and the indexer part 110. An opening for communication between the warpage measurement chamber 291 and the indexer part 110 is openable and closable by the gate valve 292. A gate valve 293 is provided in a connector portion between the warpage measurement chamber 291 and the transport chamber 170. An opening for communication between the warpage measurement chamber 291 and the transport chamber 170 is openable and closable by the gate valve 293. In other words, the warpage measurement chamber 291 and the indexer part 110 are connected to each other via the gate valve 292, and the warpage measurement chamber 291 and the transport chamber 170 are connected to each other via the gate valve 293.

The gate valve 292 is opened when a semiconductor wafer W is transferred between the indexer part 110 and the warpage measurement chamber 291. The gate valve 293 is opened when a semiconductor wafer W is transferred between the warpage measurement chamber 291 and the transport chamber 170. When the gate valve 292 and the gate valve 293 are closed, the interior of the warpage measurement chamber 291 is an enclosed space.

The warpage measurement part 290 optically measures the wafer warpage occurring in the semiconductor wafer W subjected to the heat treatment and received from the transport robot 150. After the warpage measurement is completed, the semiconductor wafer W is taken out of the warpage measurement part 290 by the transport robot 120 of the indexer part 110.

The transport robot 150 is housed in the transport chamber 170. The alignment chamber 231, the warpage measurement chamber 291, a cool chamber 131 in the cooling part 130, a cool chamber 141 in the cooling part 140, a flaw detection chamber 301 in the flaw detection part 300, a film thickness measurement chamber 401 in the film thickness measurement part 400, and a treatment chamber 6 in the heat treatment part 160 are connected around the transport chamber 170.

The transport robot 150 provided in the transport chamber 170 is pivotable about a vertical axis (Z axis) as indicated by an arrow 150R. The transport robot 150 includes two linkage mechanisms comprised of a plurality of arm segments. Transport hands 151a and 151b each for holding a semiconductor wafer W are provided at respective distal ends of the two linkage mechanisms. These transport hands 151a and 151*b* are vertically spaced a predetermined distance apart from each other, and are independently linearly slidable in the same horizontal direction by the respective linkage mechanisms. The transport robot 150 moves a base provided with the two linkage mechanisms upwardly and downwardly to thereby move the two transport hands 151*a* and 151*b* spaced the predetermined distance apart from each other upwardly and downwardly.

When the transport robot 150 transfers (loads and unloads) a semiconductor wafer W to and from the alignment chamber 231, the warpage measurement chamber 291, the cool chamber 131, the cool chamber 141, the flaw detection chamber 301, the film thickness measurement chamber 401, or the treatment chamber 6 in the heat treatment part 160 as a transfer target, both of the transport hands 151*a* and 151*b* initially pivot into opposed relation to the transfer target. Thereafter (or during the pivotal movement), the transport robot 150 moves the transport hands 151*a* and 151*b* upwardly or downwardly to position one of the transport hands 151*a* and 151*b* at the same height as the opening of the transfer target. Then, the transport robot 150 causes the transport hand 151*a* (or 151*b*) to linearly slide in a horizontal direction, thereby transferring the semiconductor wafer W to and from the transfer target.

The heat treatment part 160 which is a principal part of the heat treatment apparatus 100 is a substrate processing part for irradiating a preheated semiconductor wafer W with flashes of light from xenon flash lamps FL to perform flash heating treatment on the semiconductor wafer W. A gate valve 185 is provided between the transport chamber 170 and the treatment chamber 6 of the heat treatment part 160. The gate valve 185 is opened when a semiconductor wafer W is transferred between the treatment chamber 6 of the heat treatment part 160 and the transport chamber 170. The configuration of the heat treatment part 160 will be described later in detail.

The two cooling parts 130 and 140 are substantially similar in configuration to each other. The cooling parts 130 and 140 include respective metal cooling plates and respective quartz plates (both not shown) placed on the upper surfaces of the cooling plates in the cool chambers 131 and 141 which are housings made of an aluminum alloy. Each of the cooling plates is temperature-controlled at ordinary temperatures (approximately 23° C.) by a Peltier element or by circulation of constant-temperature water. The semiconductor wafer W subjected to the flash heating treatment in the heat treatment part 160 is transported into the cool chamber 131 or the cool chamber 141, and is then placed and cooled on a corresponding one of the quartz plates.

A gate valve 132 is provided in a connector portion between the cool chamber 131 and the transport chamber 170, and a gate valve 142 is provided in a connector portion between the cool chamber 141 and the transport chamber 170. An opening for communication between the cool chamber 131 and the transport chamber 170 is openable and closable by the gate valve 132. An opening for communication between the cool chamber 141 and the transport chamber 170 is openable and closable by the gate valve 142. In other words, the cool chamber 131 and the transport chamber 170 are connected to each other via the gate valve 132, and the cool chamber 141 and the transport chamber 170 are connected to each other via the gate valve 142.

The gate valve 132 is opened when a semiconductor wafer W is transferred between the cool chamber 131 of the cooling part 130 and the transport chamber 170. The gate valve 142 is opened when a semiconductor wafer W is transferred between the cool chamber 141 of the cooling part 140 and the transport chamber 170. When the gate valves 132 and 142 are closed, the interiors of the cool chambers 131 and 141 are enclosed spaces.

Figure 9:
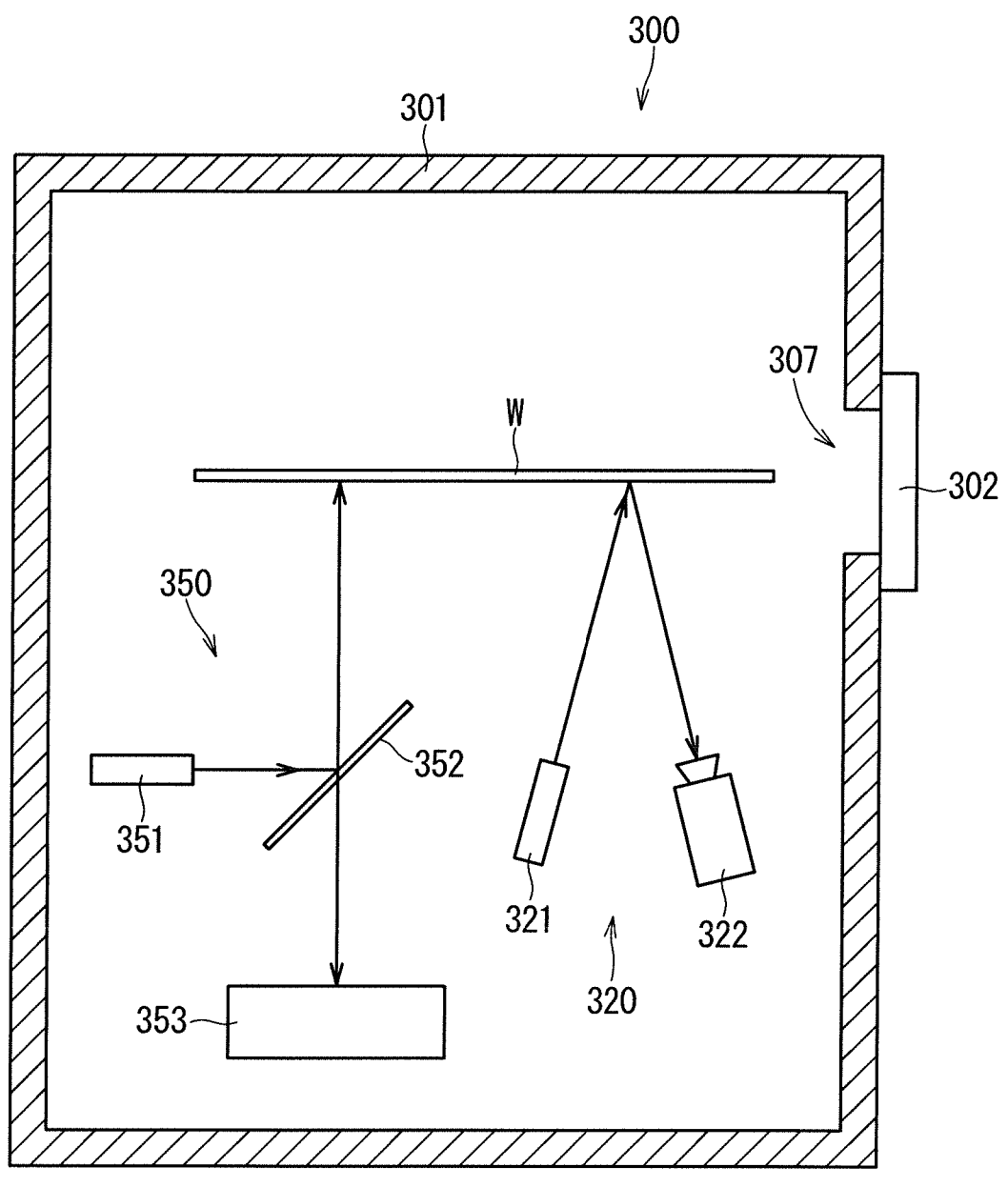
FIG. 9 is a view schematically showing a configuration of a flaw detection part.

The flaw detection part 300 detects the presence or absence of flaws in the back surface of a semiconductor wafer W. FIG. 9 is a view schematically showing a configuration of the flaw detection part 300. The flaw detection part 300 includes an imaging part 320 and a reflectance measurement part 350 both provided in the flaw detection chamber 301 which is a housing made of an aluminum alloy. A substrate support mechanism not shown is provided in the flaw detection chamber 301 for detecting the presence or absence of flaws in the back surface of the semiconductor wafer W, and supports the semiconductor wafer W. The substrate support mechanism supports the semiconductor wafer W, with the back surface of the semiconductor wafer W held open. One of the main surfaces of the semiconductor wafer W which is patterned and to be treated is a front surface, and the other main surface opposite the front surface is the back surface.

The imaging part 320 images the back surface of the semiconductor wafer W supported in a stationary state in the flaw detection chamber 301. The imaging part 320 includes a light source 321 and a camera 322. The light source 321 is, for example, an LED lamp, and irradiates the back surface of the semiconductor wafer W with light of a predetermined wavelength. The camera 322 is, for example, a line scan camera, and images the back surface of the semiconductor wafer W supported in the flaw detection chamber 301 to acquire image data. The camera 322, which is a line scan camera, is provided with a movement mechanism (not shown) for sliding the camera 322 perpendicularly to an imaging line for the purpose of imaging the back surface of the semiconductor wafer W in a linear fashion. The movement mechanism integrally slides the camera 322 and the light source 321 relative to the semiconductor wafer W. The light source 321 functions as an illuminator for the camera 322 to capture images, and illuminates at least the imaging line of the camera 322. While the light source 321 emits light and the camera 322 performs imaging, the light source 321 and the camera 322 are slid, whereby the image data about the entire back surface of the semiconductor wafer W is acquired.

The reflectance measurement part 350 measures the reflectance of the back surface of the semiconductor wafer W supported in the flaw detection chamber 301. The reflectance measurement part 350 includes a light source 351, a half mirror 352, and a spectroscope 353. The light source 351 is, for example, an LED lamp, and emits light of a predetermined wavelength. In the present preferred embodiment, the wavelength of the light emitted from the light source 321 of the imaging part 320 is equal to the wavelength of the light emitted from the light source 351 of the reflectance measurement part 350. The light emitted from the light source 351 is reflected from the half mirror 352, and the reflected light impinges on the back surface of the semiconductor wafer W. Then, the light is reflected from the back surface of the semiconductor wafer W. The reflected light passes through the half mirror 352, and enters the spectroscope 353. The spectroscope 353 measures the electromagnetic spectrum of the incident light. That is, the spectroscope 353 measures the intensity distribution of the light emitted from the light source 351 and reflected from the back surface of the semiconductor wafer W.

The reflectance measurement part 350 previously holds an intensity distribution of light reflected from bare wafers of silicon. The bare wafers are silicon wafers subjected to neither patterning nor film deposition. The reflectance measurement part 350 divides the intensity distribution of light reflected from the back surface of the semiconductor wafer W to be measured by the intensity distribution of light reflected from the bare wafers to thereby measure the relative reflectance of the back surface of the semiconductor wafer W.

An opening 307 for communication connection with the transport chamber 170 is formed in the flaw detection chamber 301. The opening 307 of the flaw detection chamber 301 is openable and closable by a gate valve 302. In other words, the flaw detection chamber 301 and the transport chamber 170 are connected to each other via the gate valve 302. The gate valve 302 is opened when a semiconductor wafer W is transferred between the flaw detection chamber 301 of the flaw detection part 300 and the transport chamber 170. When the gate valve 302 is closed, the interior of the flaw detection chamber 301 is an enclosed space.

Referring again to FIG. 1, the film thickness measurement part 400 uses, for example, a spectroscopic ellipsometry analysis technique to measure the thickness of a thin film formed on the semiconductor wafer W. The film thickness measurement part 400 includes a table for supporting a semiconductor wafer W, an optical unit, and the like that are provided in the film thickness measurement chamber 401 which is a housing made of an aluminum alloy. The optical unit of a spectroscopic ellipsometer causes light to enter the front surface of the semiconductor wafer W supported by the table, and receives light reflected from the front surface. The optical unit measures the amount of change in polarization of the reflected light for each wavelength to determine the thickness of the thin film formed on the front surface of the semiconductor wafer W, based on the obtained measurement data. It should be noted that the film thickness measurement part 400 is not limited to the aforementioned spectroscopic ellipsometer but may be an optical interference type film thickness measurement device.

A gate valve 402 is provided in a connector portion between the film thickness measurement chamber 401 and the transport chamber 170. An opening for communication between the film thickness measurement chamber 401 and the transport chamber 170 is openable and closable by the gate valve 402. In other words, the film thickness measurement chamber 401 and the transport chamber 170 are connected to each other via the gate valve 402. The gate valve 402 is opened when a semiconductor wafer W is transferred between the film thickness measurement chamber 401 of the film thickness measurement part 400 and the transport chamber 170. When the gate valve 402 is closed, the interior of the film thickness measurement chamber 401 is an enclosed space.

The heat treatment apparatus 100 has what is called a cluster tool structure in which multiple chambers are disposed around the transport chamber 170. The transport robot 150 and the transfer robot 120 constitute a transport mechanism for transporting a semiconductor wafer W from the carriers C to each processing part such as the heat treatment part 160. The transport robot 150 is also a center robot that is positioned in the center of the cooling parts 130 and 140, the flaw detection part 300, the film thickness measurement part 400, and the heat treatment part 160 to transport a semiconductor wafer W to each of these processing parts. The transfer of a semiconductor wafer W between the transport robot 150 and the transfer robot 120 is performed via the alignment part 230 and the warpage measurement part 290. Specifically, the transport robot 150 receives an untreated semiconductor wafer W transferred to the alignment chamber 231 by the transfer robot 120, and the transfer robot 120 receives a treated semiconductor wafer W transferred to the warpage measurement chamber 291 by the transport robot 150. In other words, the alignment chamber 231 serves as an outward path for semiconductor wafers W, and the warpage measurement chamber 291 serves as a return path for semiconductor wafers W.

Next, the configuration of the heat treatment part 160 will be described. FIG. 2 is a longitudinal sectional view showing the configuration of the heat treatment part 160. The heat treatment part 160 includes the treatment chamber 6 for receiving a semiconductor wafer W therein to perform heating treatment on the semiconductor wafer W, a flash lamp house 5 including the plurality of built-in flash lamps FL, and a halogen lamp house 4 including a plurality of built-in halogen lamps HL. The flash lamp house 5 is provided over the treatment chamber 6, and the halogen lamp house 4 is provided under the treatment chamber 6. The heat treatment part 160 further includes a holder 7 provided inside the treatment chamber 6 and for holding a semiconductor wafer W in a horizontal attitude, and a transfer mechanism 10 provided inside the treatment chamber 6 and for transferring a semiconductor wafer W between the holder 7 and the transport robot 150.

The treatment chamber 6 is configured such that upper and lower chamber windows 63 and 64 made of quartz are mounted to the top and bottom, respectively, of a tubular chamber side portion 61. The chamber side portion 61 has a generally tubular shape having an open top and an open bottom. The upper chamber window 63 is mounted to block the top opening of the chamber side portion 61, and the lower chamber window 64 is mounted to block the bottom opening thereof. The upper chamber window 63 forming the ceiling of the treatment chamber 6 is a disk-shaped member made of quartz, and serves as a quartz window that transmits flashes of light emitted from the flash lamps FL therethrough into the treatment chamber 6. The lower chamber window 64 forming the floor of the treatment chamber 6 is also a disk-shaped member made of quartz, and serves as a quartz window that transmits light emitted from the halogen lamps HL therethrough into the treatment chamber 6.

An upper reflective ring 68 is mounted to an upper portion of the inner wall surface of the chamber side portion 61, and a lower reflective ring 69 is mounted to a lower portion thereof. Both of the upper and lower reflective rings 68 and 69 are in the form of an annular ring. The upper reflective ring 68 is mounted by being inserted downwardly from the top of the chamber side portion 61. The lower reflective ring 69, on the other hand, is mounted by being inserted upwardly from the bottom of the chamber side portion 61 and fastened with screws not shown. In other words, the upper and lower reflective rings 68 and 69 are removably mounted to the chamber side portion 61. An interior space of the treatment chamber 6, i.e. a space surrounded by the upper chamber window 63, the lower chamber window 64, the chamber side portion 61, and the upper and lower reflective rings 68 and 69, is defined as a heat treatment space 65.

A recessed portion 62 is defined in the inner wall surface of the treatment chamber 6 by mounting the upper and lower reflective rings 68 and 69 to the chamber side portion 61. Specifically, the recessed portion 62 is defined which is surrounded by a middle portion of the inner wall surface of the chamber side portion 61 where the reflective rings 68 and 69 are not mounted, a lower end surface of the upper reflective ring 68, and an upper end surface of the lower reflective ring 69. The recessed portion 62 is provided in the form of a horizontal annular ring in the inner wall surface of the treatment chamber 6, and surrounds the holder 7 which holds a semiconductor wafer W. The chamber side portion 61 and the upper and lower reflective rings 68 and 69 are made of a metal material (e.g., stainless steel) with high strength and high heat resistance.

The chamber side portion 61 is provided with a transport opening (throat) 66 for the transport of a semiconductor wafer W therethrough into and out of the treatment chamber 6. The transport opening 66 is openable and closable by the gate valve 185. The transport opening 66 is connected in communication with an outer peripheral surface of the recessed portion 62. Thus, when the transport opening 66 is opened by the gate valve 185, a semiconductor wafer W is allowed to be transported through the transport opening 66 and the recessed portion 62 into and out of the heat treatment space 65. When the transport opening 66 is closed by the gate valve 185, the heat treatment space 65 in the treatment chamber 6 is an enclosed space.

The chamber side portion 61 is further provided with a through hole 61a and a through hole 61b both bored therein. The through hole 61a is a cylindrical hole for directing infrared light emitted from an upper surface of a semiconductor wafer W held by a susceptor 74 to be described later therethrough to an infrared sensor 29 of an upper radiation thermometer 25. The through hole 61b is a cylindrical hole for directing infrared light emitted from a lower surface of the semiconductor wafer W therethrough to an infrared sensor 24 of a lower radiation thermometer 20. The through holes 61a and 61b are inclined with respect to a horizontal direction so that the longitudinal axes (axes extending in respective directions in which the through holes 61a and 61b extend through the chamber side portion 61) of the respective through holes 61a and 61b intersect the main surfaces of the semiconductor wafer W held by the susceptor 74. A transparent window 26 made of calcium fluoride material transparent to infrared light in a wavelength range measurable by the upper radiation thermometer 25 is mounted to an end portion of the through hole 61a which faces the heat treatment space 65. A transparent window 21 made of barium fluoride material transparent to infrared light in a wavelength range measurable by the lower radiation thermometer 20 is mounted to an end portion of the through hole 61b which faces the heat treatment space 65.

At least one gas supply opening 81 for supplying a treatment gas therethrough into the heat treatment space 65 is provided in an upper portion of the inner wall of the treatment chamber 6. The gas supply opening 81 is provided above the recessed portion 62, and may be provided in the upper reflective ring 68. The gas supply opening 81 is connected in communication with a gas supply pipe 83 through a buffer space 82 provided in the form of an annular ring inside the side wall of the treatment chamber 6. The gas supply pipe 83 is connected to a treatment gas supply source 85. A valve 84 is interposed in the gas supply pipe 83. When the valve 84 is opened, the treatment gas is fed from the treatment gas supply source 85 to the buffer space 82. The treatment gas flowing in the buffer space 82 flows in a spreading manner within the buffer space 82 which is lower in fluid resistance than the gas supply opening 81, and is supplied through the gas supply opening 81 into the heat treatment space 65. Examples of the treatment gas usable herein include: inert gases such as nitrogen gas ($N_2$), argon (Ar), and helium (He); and reactive gases such as hydrogen ($H_2$), ammonia ($NH_3$), oxygen ($O_2$), ozone ($O_3$), nitrogen monoxide (NO), nitrous oxide ($N_2O$), and nitrogen dioxide ($NO_2$) (although nitrogen gas is used in the present preferred embodiment).

At least one gas exhaust opening 86 for exhausting a gas from the heat treatment space 65 is provided in a lower portion of the inner wall of the treatment chamber 6. The gas exhaust opening 86 is provided below the recessed portion 62, and may be provided in the lower reflective ring 69. The gas exhaust opening 86 is connected in communication with a gas exhaust pipe 88 through a buffer space 87 provided in the form of an annular ring inside the side wall of the treatment chamber 6. The gas exhaust pipe 88 is connected to an exhaust mechanism 190. A valve 89 is interposed in the gas exhaust pipe 88. When the valve 89 is opened, the gas in the heat treatment space 65 is exhausted through the gas exhaust opening 86 and the buffer space 87 to the gas exhaust pipe 88. The at least one gas supply opening 81 and the at least one gas exhaust opening 86 may include a plurality of gas supply openings 81 and a plurality of gas exhaust openings 86, respectively, arranged in a circumferential direction of the treatment chamber 6, and may be in the form of slits. The treatment gas supply source 85 and the exhaust mechanism 190 may be mechanisms provided in the heat treatment apparatus 100 or be utility systems in a factory in which the heat treatment apparatus 100 is installed.

A gas exhaust pipe 191 for exhausting the gas from the heat treatment space 65 is also connected to a distal end of the transport opening 66. The gas exhaust pipe 191 is connected through a valve 192 to the exhaust mechanism 190. By opening the valve 192, the gas in the treatment chamber 6 is exhausted through the transport opening 66.

Figure 3:
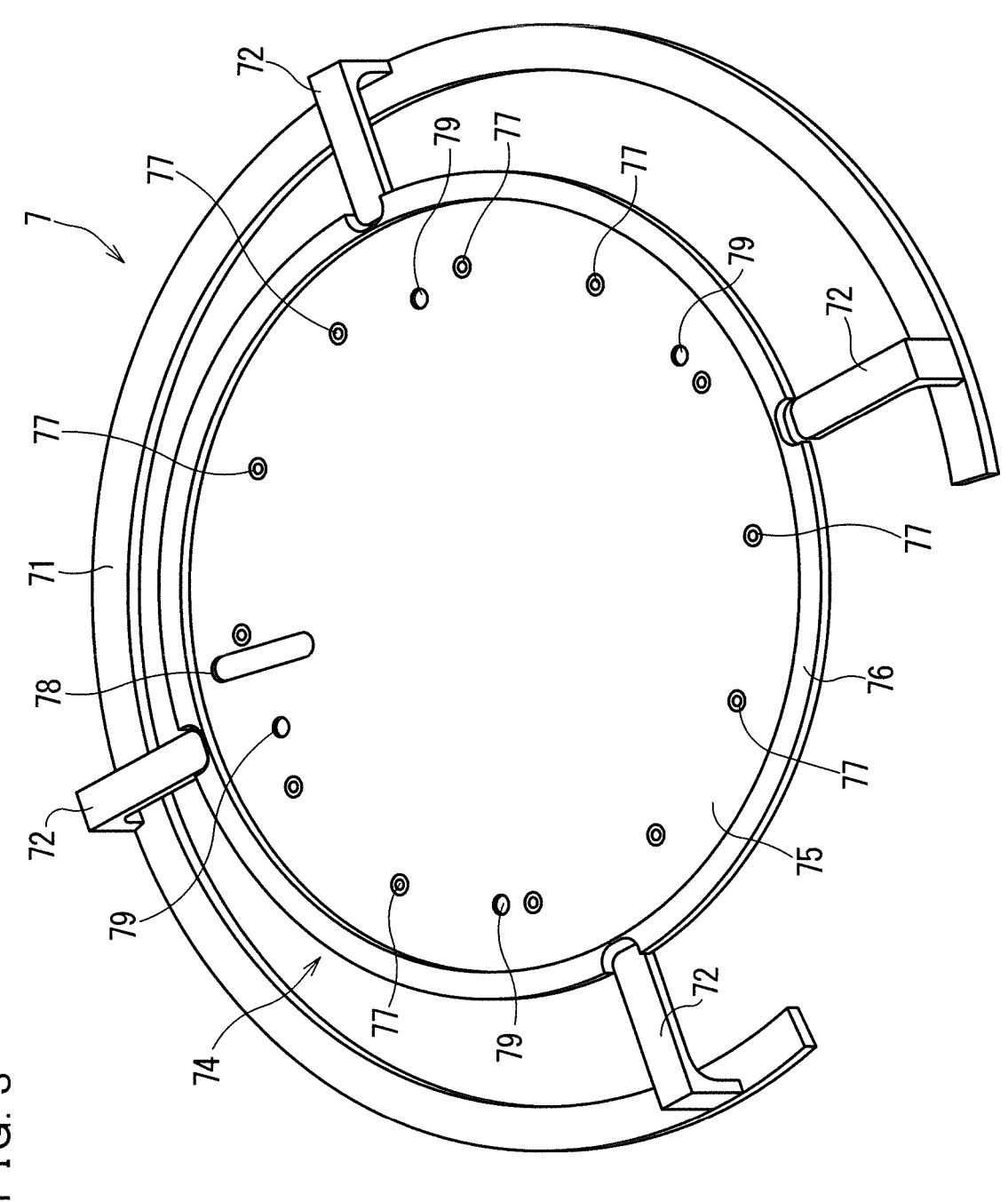
FIG. 3 is a perspective view showing the entire external appearance of a holder.

FIG. 3 is a perspective view showing the entire external appearance of the holder 7. The holder 7 includes a base ring 71, coupling portions 72, and the susceptor 74. The base ring 71, the coupling portions 72, and the susceptor 74 are all made of quartz. In other words, the whole of the holder 7 is made of quartz.

The base ring 71 is a quartz member having an arcuate shape obtained by removing a portion from an annular shape. This removed portion is provided to prevent interference between transfer arms 11 of the transfer mechanism 10 to be described later and the base ring 71. The base ring 71 is supported by the wall surface of the treatment chamber 6 by being placed on the bottom surface of the recessed portion 62 (with reference to FIG. 2). The multiple coupling portions 72 (in the present preferred embodiment, four coupling portions 72) are mounted upright on the upper surface of the base ring 71 and arranged in a circumferential direction of the annular shape thereof. The coupling portions 72 are quartz members, and are rigidly secured to the base ring 71 by welding.

Figures 4, 5:
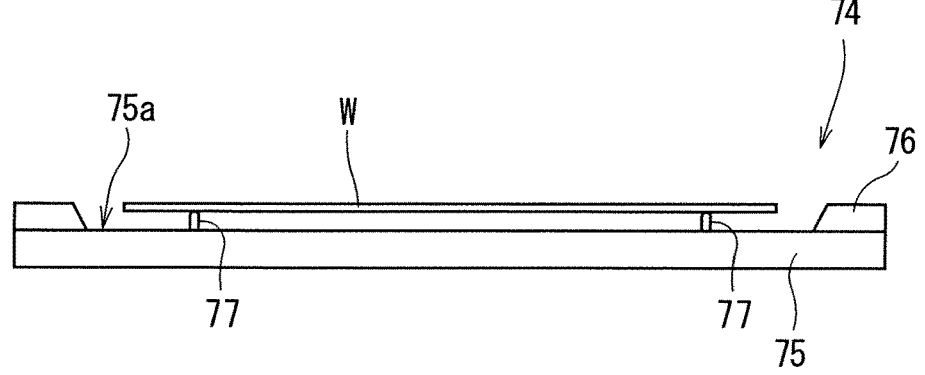
FIG. 4 is a plan view of a susceptor.
FIG. 5 is a sectional view of the susceptor.

The susceptor 74 is supported by the four coupling portions 72 provided on the base ring 71. FIG. 4 is a plan view of the susceptor 74. FIG. 5 is a sectional view of the susceptor 74. The susceptor 74 includes a holding plate 75, a guide ring 76, and a plurality of substrate support pins 77. The holding plate 75 is a generally circular planar member made of quartz. The diameter of the holding plate 75 is greater than that of a semiconductor wafer W. In other words, the holding plate 75 has a size, as seen in plan view, greater than that of the semiconductor wafer W.

The guide ring 76 is provided on a peripheral portion of the upper surface of the holding plate 75. The guide ring 76 is an annular member having an inner diameter greater than the diameter of the semiconductor wafer W. For example, when the diameter of the semiconductor wafer W is 300 mm, the inner diameter of the guide ring 76 is 320 mm. The inner periphery of the guide ring 76 is in the form of a tapered surface which becomes wider in an upward direction from the holding plate 75. The guide ring 76 is made of quartz similar to that of the holding plate 75. The guide ring 76 may be welded to the upper surface of the holding plate 75 or fixed to the holding plate 75 with separately machined pins and the like. Alternatively, the holding plate 75 and the guide ring 76 may be machined as an integral member.

A region of the upper surface of the holding plate 75 which is inside the guide ring 76 serves as a planar holding surface 75a for holding the semiconductor wafer W. The substrate support pins 77 are provided upright on the holding surface 75a of the holding plate 75. In the present preferred embodiment, a total of 12 substrate support pins 77 are spaced at intervals of 30 degrees along the circumference of a circle concentric with the outer circumference of the holding surface 75a (the inner circumference of the guide ring 76). The diameter of the circle on which the 12 substrate support pins 77 are disposed (the distance between opposed ones of the substrate support pins 77) is smaller than the diameter of the semiconductor wafer W, and is 270 to 280 mm (in the present preferred embodiment, 270 mm) when the diameter of the semiconductor wafer W is 300 mm. Each of the substrate support pins 77 is made of quartz. The substrate support pins 77 may be provided by welding on the upper surface of the holding plate 75 or machined integrally with the holding plate 75.

Referring again to FIG. 3, the four coupling portions 72 provided upright on the base ring 71 and the peripheral portion of the holding plate 75 of the susceptor 74 are rigidly secured to each other by welding. In other words, the susceptor 74 and the base ring 71 are fixedly coupled to each other with the coupling portions 72. The base ring 71 of such a holder 7 is supported by the wall surface of the treatment chamber 6, whereby the holder 7 is mounted to the treatment chamber 6. With the holder 7 mounted to the treatment chamber 6, the holding plate 75 of the susceptor 74 assumes a horizontal attitude (an attitude such that the normal to the holding plate 75 coincides with a vertical direction). In other words, the holding surface 75a of the holding plate 75 becomes a horizontal surface.

A semiconductor wafer W transported into the treatment chamber 6 is placed and held in a horizontal attitude on the susceptor 74 of the holder 7 mounted to the treatment chamber 6. At this time, the semiconductor wafer W is supported by the 12 substrate support pins 77 provided upright on the holding plate 75, and is held by the susceptor 74. More strictly speaking, the 12 substrate support pins 77 have respective upper end portions coming in contact with the lower surface of the semiconductor wafer W to support the semiconductor wafer W. The semiconductor wafer W is supported in a horizontal attitude by the 12 substrate support pins 77 because the 12 substrate support pins 77 have a uniform height (distance from the upper ends of the substrate support pins 77 to the holding surface 75a of the holding plate 75).

The semiconductor wafer W supported by the substrate support pins 77 is spaced a predetermined distance apart from the holding surface 75a of the holding plate 75. The thickness of the guide ring 76 is greater than the height of the substrate support pins 77. Thus, the guide ring 76 prevents the horizontal misregistration of the semiconductor wafer W supported by the substrate support pins 77.

As shown in FIGS. 3 and 4, an opening 78 is provided in the holding plate 75 of the susceptor 74 so as to extend vertically through the holding plate 75 of the susceptor 74.

The opening 78 is provided for the lower radiation thermometer 20 to receive radiation (infrared light) emitted from the lower surface of the semiconductor wafer W. Specifically, the lower radiation thermometer 20 receives the radiation emitted from the lower surface of the semiconductor wafer W through the opening 78 and the transparent window 21 mounted to the through hole 61b in the chamber side portion 61 to measure the temperature of the semiconductor wafer W. Further, the holding plate 75 of the susceptor 74 further includes four through holes 79 bored therein and designed so that lift pins 12 of the transfer mechanism 10 to be described later pass through the through holes 79, respectively, to transfer a semiconductor wafer W.

FIG. 6 is a plan view of the transfer mechanism 10. FIG. 7 is a side view of the transfer mechanism 10. The transfer mechanism 10 includes the two transfer arms 11. The transfer arms 11 are of an arcuate configuration extending substantially along the annular recessed portion 62. Each of the transfer arms 11 includes the two lift pins 12 mounted upright thereon. The transfer arms 11 are pivotable by a horizontal movement mechanism 13. The horizontal movement mechanism 13 moves the pair of transfer arms 11 horizontally between a transfer operation position (a position indicated by solid lines in FIG. 6) in which a semiconductor wafer W is transferred to and from the holder 7 and a retracted position (a position indicated by dash-double-dot lines in FIG. 6) in which the transfer arms 11 do not overlap the semiconductor wafer W held by the holder 7 as seen in plan view. The transfer operation position is under the susceptor 74, and the retracted position is outside the susceptor 74. The horizontal movement mechanism 13 may be of the type which causes individual motors to pivot the transfer arms 11 respectively or of the type which uses a linkage mechanism to cause a single motor to pivot the pair of transfer arms 11 in cooperative relation.

The transfer arms 11 are moved upwardly and downwardly together with the horizontal movement mechanism 13 by an elevating mechanism 14. As the elevating mechanism 14 moves up the pair of transfer arms 11 in their transfer operation position, the four lift pins 12 in total pass through the respective four through holes 79 (with reference to FIGS. 3 and 4) bored in the susceptor 74, so that the upper ends of the lift pins 12 protrude from the upper surface of the susceptor 74. On the other hand, as the elevating mechanism 14 moves down the pair of transfer arms 11 in their transfer operation position to take the lift pins 12 out of the respective through holes 79 and the horizontal movement mechanism 13 moves the pair of transfer arms 11 so as to open the transfer arms 11, the transfer arms 11 move to their retracted position. The retracted position of the pair of transfer arms 11 is immediately over the base ring 71 of the holder 7. The retracted position of the transfer arms 11 is inside the recessed portion 62 because the base ring 71 is placed on the bottom surface of the recessed portion 62. An exhaust mechanism not shown is also provided near the location where the drivers (the horizontal movement mechanism 13 and the elevating mechanism 14) of the transfer mechanism 10 are provided, and is configured to exhaust an atmosphere around the drivers of the transfer mechanism 10 to the outside of the treatment chamber 6.

As shown in FIG. 2, the treatment chamber 6 is provided with the two radiation thermometers (in the present preferred embodiment, pyrometers): the upper radiation thermometer 25 and the lower radiation thermometer 20. The upper radiation thermometer 25 is provided obliquely above the semiconductor wafer W held by the susceptor 74, and receives the infrared radiation emitted from the upper surface of the semiconductor wafer W to measure the temperature of the upper surface of the semiconductor wafer W. The infrared sensor 29 of the upper radiation thermometer 25 includes an optical element made of InSb (indium antimonide) so as to be able to respond to rapid changes in temperature of the upper surface of the semiconductor wafer W at the moment of flash irradiation. On the other hand, the lower radiation thermometer 20 is provided obliquely below the semiconductor wafer W held by the susceptor 74, and receives the infrared radiation emitted from the lower surface of the semiconductor wafer W to measure the temperature of the lower surface of the semiconductor wafer W.

The flash lamp house 5 provided over the treatment chamber 6 includes an enclosure 51, a light source provided inside the enclosure 51 and including the multiple (in the present preferred embodiment, 30) xenon flash lamps FL, and a reflector 52 provided inside the enclosure 51 so as to cover the light source from above. The flash lamp house 5 further includes a lamp light radiation window 53 mounted to the bottom of the enclosure 51. The lamp light radiation window 53 forming the floor of the flash lamp house 5 is a plate-like quartz window made of quartz. The flash lamp house 5 is provided over the treatment chamber 6, whereby the lamp light radiation window 53 is opposed to the upper chamber window 63. The flash lamps FL direct flashes of light from over the treatment chamber 6 through the lamp light radiation window 53 and the upper chamber window 63 toward the heat treatment space 65.

The flash lamps FL, each of which is a rod-shaped lamp having an elongated cylindrical shape, are arranged in a plane so that the longitudinal directions of the respective flash lamps FL are in parallel with each other along a main surface of a semiconductor wafer W held by the holder 7 (that is, in a horizontal direction). Thus, a plane defined by the arrangement of the flash lamps FL is also a horizontal plane.

Each of the xenon flash lamps FL includes a rod-shaped glass tube (discharge tube) containing xenon gas sealed therein and having positive and negative electrodes provided on opposite ends thereof and connected to a capacitor, and a trigger electrode attached to the outer peripheral surface of the glass tube. Because the xenon gas is electrically insulative, no current flows in the glass tube in a normal state even if electrical charge is stored in the capacitor. However, if a high voltage is applied to the trigger electrode to produce an electrical breakdown, electricity stored in the capacitor flows momentarily in the glass tube, and xenon atoms or molecules are excited at this time to cause light emission. Such a xenon flash lamp FL has the property of being capable of emitting extremely intense light as compared with a light source that stays lit continuously such as a halogen lamp HL because the electrostatic energy previously stored in the capacitor is converted into an ultrashort light pulse ranging from 0.1 to 100 milliseconds. Thus, the flash lamps FL are pulsed light emitting lamps which emit light instantaneously for an extremely short time period of less than one second. The light emission time of the flash lamps FL is adjustable by the coil constant of a lamp light source which supplies power to the flash lamps FL.

The reflector 52 is provided over the plurality of flash lamps FL so as to cover all of the flash lamps FL. A fundamental function of the reflector 52 is to reflect flashes of light emitted from the plurality of flash lamps FL toward the heat treatment space 65. The reflector 52 is a plate made of an aluminum alloy. A surface of the reflector 52 (a surface which faces the flash lamps FL) is roughened by abrasive blasting.

The halogen lamp house 4 provided under the treatment chamber 6 includes an enclosure 41 incorporating the multiple (in the present preferred embodiment, 40) halogen lamps HL. The halogen lamps HL direct light from under the treatment chamber 6 through the lower chamber window 64 toward the heat treatment space 65.

FIG. 8 is a plan view showing an arrangement of the multiple halogen lamps HL. In the present preferred embodiment, 20 halogen lamps HL are arranged in each of two tiers, i.e. upper and lower tiers. Each of the halogen lamps HL is a rod-shaped lamp having an elongated cylindrical shape. The 20 halogen lamps HL in each of the upper and lower tiers are arranged so that the longitudinal directions thereof are in parallel with each other along a main surface of a semiconductor wafer W held by the holder 7 (that is, in a horizontal direction). Thus, a plane defined by the arrangement of the halogen lamps HL in each of the upper and lower tiers is also a horizontal plane.

As shown in FIG. 8, the halogen lamps HL in each of the upper and lower tiers are disposed at a higher density in a region opposed to a peripheral portion of the semiconductor wafer W held by the holder 7 than in a region opposed to a central portion thereof. In other words, the halogen lamps HL in each of the upper and lower tiers are arranged at shorter intervals in a peripheral portion of the lamp arrangement than in a central portion thereof. This allows a greater amount of light to impinge upon the peripheral portion of the semiconductor wafer W where a temperature decrease is prone to occur when the semiconductor wafer W is heated by the irradiation thereof with light from the halogen lamps HL.

The group of halogen lamps HL in the upper tier and the group of halogen lamps HL in the lower tier are arranged to intersect each other in a lattice pattern. In other words, the 40 halogen lamps HL in total are disposed so that the longitudinal direction of the halogen lamps HL arranged in the upper tier and the longitudinal direction of the halogen lamps HL arranged in the lower tier are orthogonal to each other.

Each of the halogen lamps HL is a filament-type light source which passes current through a filament disposed in a glass tube to make the filament incandescent, thereby emitting light. A gas prepared by introducing a halogen element (iodine, bromine and the like) in trace amounts into an inert gas such as nitrogen, argon and the like is sealed in the glass tube. The introduction of the halogen element allows the temperature of the filament to be set at a high temperature while suppressing a break in the filament. Thus, the halogen lamps HL have the properties of having a longer life than typical incandescent lamps and being capable of continuously emitting intense light. That is, the halogen lamps HL are continuous lighting lamps that emit light continuously for not less than one second. In addition, the halogen lamps HL, which are rod-shaped lamps, have a long life. The arrangement of the halogen lamps HL in a horizontal direction provides good efficiency of radiation toward the semiconductor wafer W provided over the halogen lamps HL.

A reflector 43 is provided also inside the enclosure 41 of the halogen lamp house 4 under the halogen lamps HL arranged in two tiers (FIG. 2). The reflector 43 reflects the light emitted from the halogen lamps HL toward the heat treatment space 65.

The controller 3 controls the aforementioned various operating mechanisms provided in the heat treatment apparatus 100. FIG. 10 is a block diagram showing a configuration of the controller 3. The controller 3 is similar in hardware configuration to a typical computer. Specifically, the controller 3 includes a CPU that is a circuit for performing various computation processes, a ROM or read-only memory for storing a basic program therein, a RAM or readable/writable memory for storing various pieces of information therein, and a storage part 34 (e.g., a magnetic disk or an SSD) for storing control software, data and the like thereon. The CPU in the controller 3 executes a predetermined processing program, whereby the processes in the heat treatment apparatus 100 proceed. The controller 3 is shown in the indexer part 110 in FIG. 1. The present invention, however, is not limited to this. The controller 3 may be disposed in any position in the heat treatment apparatus 100.

The controller 3 includes an adjustment part 31 and a flaw determination part 32. The adjustment part 31 and the flaw determination part 32 are functional processing parts implemented by the CPU of the controller 3 executing a predetermined processing program. The details on the processing in the adjustment part 31 and the flaw determination part 32 will be further described later.

Components such as the reflectance measurement part 350, the camera 322, and the transport robot 150 are electrically connected to the controller 3. The controller 3 receives measurement data and imaging data from the reflectance measurement part 350 and the camera 322, and also controls the operation of the transport robot 150 and the like.

The controller 3 is connected to a display part 37 and an input part 36. The display part 37 and the input part 36 function as a user interface for the heat treatment apparatus 100. The controller 3 causes a variety of pieces of information to appear on the display part 37. An operator of the heat treatment apparatus 100 may input various commands and parameters from the input part 36 while viewing the information appearing on the display part 37. A keyboard and a mouse, for example, may be used as the input part 36. A liquid crystal display, for example, may be used as the display part 37. In the present preferred embodiment, a liquid crystal touch panel provided on an outer wall of the heat treatment apparatus 100 is used to function as both the display part 37 and the input part 36.

The heat treatment part 160 further includes, in addition to the aforementioned components, various cooling structures to prevent an excessive temperature rise in the halogen lamp house 4, the flash lamp house 5, and the treatment chamber 6 because of the heat energy generated from the halogen lamps HL and the flash lamps FL during the heat treatment of a semiconductor wafer W. As an example, a water cooling tube (not shown) is provided in the walls of the treatment chamber 6. Also, the halogen lamp house 4 and the flash lamp house 5 have an air cooling structure for forming a gas flow therein to exhaust heat. Air is supplied to a gap between the upper chamber window 63 and the lamp light radiation window 53 to cool down the flash lamp house 5 and the upper chamber window 63.

Nitrogen is supplied from an inert gas supply mechanism not shown to the cool chambers 131 and 141, the flaw detection chamber 301, the film thickness measurement chamber 401, the alignment chamber 231, the warpage measurement chamber 291, and the transport chamber 170. At the same time, an exhaust mechanism exhausts gas from the cool chambers 131 and 141, the flaw detection chamber 301, the film thickness measurement chamber 401, the alignment chamber 231, the warpage measurement chamber 291, and the transport chamber 170. This maintains a low oxygen concentration atmosphere in each of the chambers.

Next, a processing operation in the heat treatment apparatus 100 according to the present invention will be described. FIG. 11 is a flow diagram showing a procedure for the processing operation in the heat treatment apparatus 100. The procedure for the processing operation in the heat treatment apparatus 100 which will be described below proceeds under the control of the controller 3 over the operating mechanisms of the heat treatment apparatus 100.

First, while being stored in a carrier C, untreated semiconductor wafers W of silicon are placed on any one of the three load ports 111 of the indexer part 110. The transfer robot 120 takes an untreated semiconductor wafer W out of the carrier C (Step S1). The transfer robot 120 transports the semiconductor wafer W taken out of the carrier C into the alignment chamber 231 of the alignment part 230. The alignment part 230 rotates the semiconductor wafer W transported into the alignment chamber 231 in a horizontal plane about a vertical axis passing through the central portion of the semiconductor wafer W, and optically detects a notch or the like to thereby adjust the orientation of the semiconductor wafer W.

Next, the transport robot 150 transports the semiconductor wafer W from the alignment chamber 231 to the transport chamber 170. Then, the transport robot 150 transports the semiconductor wafer W into the flaw detection chamber 301 of the flaw detection part 300 (Step S2). The semiconductor wafer W transported into the flaw detection chamber 301 is supported in a horizontal attitude in a stationary state by the substrate support mechanism not shown.

Subsequently, the reflectance measurement part 350 measures the reflectance of the back surface of the semiconductor wafer W received in the flaw detection chamber 301 (Step S3). Light emitted from the light source 351 and reflected from the half mirror 352 impinges on the back surface of the semiconductor wafer W (FIG. 9). The light is reflected from the back surface of the semiconductor wafer W. The reflected light passes through the half mirror 352, and enters the spectroscope 353. The spectroscope 353 measures the intensity distribution of the incident light for each wavelength. That is, the spectroscope 353 measures the intensity distribution of the light emitted from the light source 351 and reflected from the back surface of the semiconductor wafer W.

The reflectance measurement part 350 measures the relative reflectance of the back surface of the semiconductor wafer W using the previously held intensity distribution of the light reflected from bare wafers of silicon as a reference value. Specifically, the reflectance measurement part 350 divides the intensity distribution of light reflected from the back surface of the semiconductor wafer W determined by the spectroscope 353 by the intensity distribution of light reflected from the bare wafers to thereby calculate the relative reflectance of the back surface of the semiconductor wafer W. The term "reflectance" simply as used hereinafter means a relative reflectance.

Typically, the semiconductor wafer W is subjected to various film deposition processes in a step preceding the heat treatment apparatus 100. In the film deposition step, the type and thickness of films on the front surface of the semiconductor wafer W on which the device is to be formed are strictly controlled, whereas no special control is often exercised on the back surface of the semiconductor wafer W. As a result, disordered film deposition is performed on the back surface of the semiconductor wafer W in some cases. Thin films on the back surface of the semiconductor wafer W are to be finally removed, but still remain in the stage of processing in the heat treatment apparatus 100. The thin films deposited on the back surface of the semiconductor wafer W exert influence on the reflectance of the back surface of the semiconductor wafer W. For this reason, the reflectance of the back surface of the semiconductor wafer W is measured by the reflectance measurement part 350. In general, when an oxide film or a nitride film is deposited on the back surface of the semiconductor wafer W, the reflectance of the back surface of the semiconductor wafer W is lower than that of the bare wafers (i.e., the relative reflectance is less than 100%). On the other hand, when a metal layer is formed on the back surface of the semiconductor wafer W, the back surface becomes a mirror surface, so that the reflectance of the back surface is higher than that of the bare wafers (i.e., the relative reflectance is greater than 100%).

Next, the adjustment part 31 of the controller 3 adjusts imaging parameters of the camera 322, based on the reflectance of the back surface of the semiconductor wafer W measured by the reflectance measurement part 350 (Step S4). The imaging parameters including, for example, exposure time, sensitivity, and the like are set in the camera 322. The imaging parameters suitable for the imaging of the bare wafers as a default, i.e. the imaging parameters suitable when the relative reflectance is 100%, are set in the camera 322.

The adjustment part 31 adjusts the imaging parameters set in the camera 322 so that the imaging parameters are suitable for the imaging of the back surface of the semiconductor wafer W to be treated, based on the reflectance of the back surface of the semiconductor wafer W measured by the reflectance measurement part 350. Specifically, the adjustment part 31 adjusts the imaging parameters of the camera 322, based on a correlation table 35 held in the storage part 34 of the controller 3. In the present preferred embodiment, the adjustment part 31 adjusts the exposure time of the camera 322 as an imaging parameter.

FIG. 12 is a graph showing an example of the correlation table 35. The correlation table 35 shows a suitable correlation for the imaging by means of the camera 322 between the reflectance of the back surface of the semiconductor wafer W and the exposure time. As shown in FIG. 12, it is suitable that the lower the reflectance of the back surface of the semiconductor wafer W is, the longer the exposure time of the camera 322 is. Such a correlation may be determined in advance by experiment or simulation, created as the correlation table 35, and stored in the storage part 34.

The adjustment part 31 adjusts the exposure time of the camera 322 in accordance with the correlation table 35 shown in FIG. 12. Exposure time E1 suitable for the imaging of the bare wafers (with a relative reflectance of 100%) is set as a default in the camera 322. When the reflectance of the back surface of the semiconductor wafer W measured by the reflectance measurement part 350 is higher than that of the bare wafers (i.e., when the relative reflectance >100%), the adjustment part 31 makes the exposure time shorter than the value E1. On the other hand, when the reflectance of the back surface of the semiconductor wafer W measured by the reflectance measurement part 350 is lower than that of the bare wafers (i.e., when the relative reflectance <100%), the adjustment part 31 makes the exposure time longer than the value E1. In other words, the adjustment part 31 increases the exposure time of the camera 322 as the reflectance of the back surface of the semiconductor wafer W measured by the reflectance measurement part 350 decreases. The imaging parameter adjusted by the adjustment part 31 is set in the camera 322.

Next, the back surface of the semiconductor wafer W supported in the flaw detection chamber 301 is imaged by the camera 322 (Step S5). While an area to be imaged is irradiated with light from the light source 321, the camera 322 images the back surface of the semiconductor wafer W to acquire image data. The wavelength of the light directed from the light source 351 onto the back surface of the semiconductor wafer W when the reflectance measurement part 350 measures the reflectance in Step S3 is equal to the wavelength of light directed from the light source 321 onto the back surface of the semiconductor wafer W when the camera 322 performs the imaging in Step S5. Since the imaging parameter of the camera 322 is adjusted to a suitable value in accordance with the reflectance of the back surface of the semiconductor wafer W in Step S4, the camera 322 appropriately images the back surface of the semiconductor wafer W to acquire image data. The acquired image data may be sent to the controller 3 and stored in the storage part 34.

After the completion of the imaging by means of the camera 322, the flaw determination part 32 determines whether there is a flaw in the back surface of the semiconductor wafer W or not (Step S6). By performing predetermined image processing on the image data acquired by the camera 322 imaging the back surface of the semiconductor wafer W, the flaw determination part 32 determines whether there is a flaw in the back surface of the semiconductor wafer W or not.

If the flaw determination part 32 detects any flaw in the back surface of the semiconductor wafer W, there is a danger that the semiconductor wafer W is cracked when the semiconductor wafer W is irradiated with a flash of light in the heat treatment part 160. To avoid the danger, the processing of the semiconductor wafer W in which the flaw is detected is interrupted, and the semiconductor wafer W is returned to the carrier C. Specifically, the transport robot 150 transports the semiconductor wafer W having the flaw from the flaw detection chamber 301 into the warpage measurement chamber 291 of the warpage measurement part 290. Then, the transfer robot 120 takes the semiconductor wafer W out of the warpage measurement chamber 291 and returns the semiconductor wafer W to the carrier C.

On the other hand, if the flaw determination part 32 detects no flaws in the back surface of the semiconductor wafer W, the transport robot 150 transports the semiconductor wafer W from the flaw detection chamber 301 into the film thickness measurement chamber 401 of the film thickness measurement part 400. The film thickness measurement part 400 measures the thickness of a thin film formed on the front surface of the semiconductor wafer W transported into the film thickness measurement chamber 401. At this time, the film thickness measurement part 400 measures the film thickness of the semiconductor wafer W prior to the heat treatment in the heat treatment part 160. Even prior to the heat treatment, a native oxide film is formed on the front surface of the semiconductor wafer W of silicon. The film thickness measurement part 400 measures the thickness of the native oxide film.

After the completion of the film thickness measurement prior to the treatment, the transport robot 150 transports the semiconductor wafer W from the film thickness measurement chamber 401 into the treatment chamber 6 of the heat treatment part 160. In the heat treatment part 160, the heating treatment of the semiconductor wafer W is performed (Step S7).

Prior to the transport of the semiconductor wafer W into the treatment chamber 6, the valve 84 is opened for supply of gas, and the valves 89 and 192 for exhaust of gas are opened, so that the supply and exhaust of gas into and out of the treatment chamber 6 start. When the valve 84 is opened, nitrogen gas is supplied through the gas supply opening 81 into the heat treatment space 65. When the valve 89 is opened, the gas within the treatment chamber 6 is exhausted through the gas exhaust opening 86. This causes the nitrogen gas supplied from an upper portion of the heat treatment space 65 in the treatment chamber 6 to flow downwardly and then to be exhausted from a lower portion of the heat treatment space 65. The gas within the treatment chamber 6 is exhausted also through the transport opening 66 by opening the valve 192. Further, the exhaust mechanism not shown exhausts an atmosphere near the drivers of the transfer mechanism 10.

Subsequently, the gate valve 185 is opened to open the transport opening 66. The transport robot 150 transports the semiconductor wafer W to be treated through the transport opening 66 into the heat treatment space 65 of the treatment chamber 6. The transport robot 150 moves the transport hand 151*a* (or the transport hand 151*b*) holding the untreated semiconductor wafer W forward to a position lying immediately over the holder 7, and stops the transport hand 151*a* (or the transport hand 151*b*) thereat. Then, the pair of transfer arms 11 of the transfer mechanism 10 is moved horizontally from the retracted position to the transfer operation position and is then moved upwardly, whereby the lift pins 12 pass through the through holes 79 and protrude from the upper surface of the holding plate 75 of the susceptor 74 to receive the semiconductor wafer W. At this time, the lift pins 12 move upwardly to above the upper ends of the substrate support pins 77.

After the untreated semiconductor wafer W is placed on the lift pins 12, the transport robot 150 causes the transport hand 151*a* to move out of the heat treatment space 65, and the gate valve 185 closes the transport opening 66. Then, the pair of transfer arms 11 moves downwardly to transfer the semiconductor wafer W from the transfer mechanism 10 to the susceptor 74 of the holder 7, so that the semiconductor wafer W is held in a horizontal attitude from below. The semiconductor wafer W is supported by the substrate support pins 77 provided upright on the holding plate 75, and is held by the susceptor 74. The semiconductor wafer W is held by the holder 7 in such an attitude that the front surface to be treated is the upper surface. A predetermined distance is defined between the back surface of the semiconductor wafer W supported by the substrate support pins 77 and the holding surface 75*a* of the holding plate 75. The pair of transfer arms 11 moved downwardly below the susceptor 74 is moved back to the retracted position, i.e. to the inside of the recessed portion 62, by the horizontal movement mechanism 13.

After the semiconductor wafer W is transported into the treatment chamber 6 and held by the susceptor 74, the 40 halogen lamps HL turn on simultaneously to start preheating (or assist-heating). Halogen light emitted from the halogen lamps HL is transmitted through the lower chamber window 64 and the susceptor 74 both made of quartz, and impinges upon the lower surface of the semiconductor wafer W. By receiving light irradiation from the halogen lamps HL, the semiconductor wafer W is preheated, so that the temperature of the semiconductor wafer W increases. It should be noted that the transfer arms 11 of the transfer mechanism 10, which are retracted to the inside of the recessed portion 62, do not become an obstacle to the heating using the halogen lamps HL.

The temperature of the semiconductor wafer W is measured by the lower radiation thermometer 20 when the halogen lamps HL perform the preheating.

Specifically, the lower radiation thermometer 20 receives infrared radiation emitted from the lower surface of the semiconductor wafer W held by the susceptor 74 through the opening 78 to measure the temperature of the semiconductor wafer W which is on the increase. The measured temperature of the semiconductor wafer W is transmitted to the controller 3. The controller 3 controls the output from the halogen lamps HL while monitoring whether the temperature of the semiconductor wafer W which is on the increase by the irradiation with light from the halogen lamps HL reaches a predetermined preheating temperature T1 or not. In other words, the controller 3 effects feedback control of the output from the halogen lamps HL so that the temperature of the semiconductor wafer W is equal to the preheating temperature T1, based on the value measured by the lower radiation thermometer 20.

After the temperature of the semiconductor wafer W reaches the preheating temperature T1, the controller 3 maintains the temperature of the semiconductor wafer W at the preheating temperature T1 for a short time. Specifically, at the point in time when the temperature of the semiconductor wafer W measured by the lower radiation thermometer 20 reaches the preheating temperature T1, the controller 3 adjusts the output from the halogen lamps HL to maintain the temperature of the semiconductor wafer W at approximately the preheating temperature T1.

By performing such preheating using the halogen lamps HL, the temperature of the entire semiconductor wafer W is uniformly increased to the preheating temperature T1. In the stage of preheating using the halogen lamps HL, the semiconductor wafer W shows a tendency to be lower in temperature in a peripheral portion thereof where heat dissipation is liable to occur than in a central portion thereof. However, the halogen lamps HL in the halogen lamp house 4 are disposed at a higher density in the region opposed to the peripheral portion of the semiconductor wafer W than in the region opposed to the central portion thereof. This causes a greater amount of light to impinge upon the peripheral portion of the semiconductor wafer W where heat dissipation is liable to occur, thereby providing a uniform in-plane temperature distribution of the semiconductor wafer W in the stage of preheating.

The flash lamps FL irradiate the front surface of the semiconductor wafer W with a flash of light at the point in time when a predetermined time period has elapsed since the temperature of the semiconductor wafer W reached the preheating temperature T1. At this time, part of the flash of light emitted from the flash lamps FL travels directly toward the interior of the treatment chamber 6. The remainder of the flash of light is reflected once from the reflector 52, and then travels toward the interior of the treatment chamber 6. The irradiation of the semiconductor wafer W with such flashes of light achieves the flash heating of the semiconductor wafer W.

The flash heating, which is achieved by the emission of a flash of light from the flash lamps FL, is capable of increasing the front surface temperature of the semiconductor wafer W in a short time. Specifically, the flash of light emitted from the flash lamps FL is an intense flash of light emitted for an extremely short period of time ranging from about 0.1 to about 100 milliseconds as a result of the conversion of the electrostatic energy previously stored in the capacitor into such an ultrashort light pulse. The front surface temperature of the semiconductor wafer W subjected to the flash heating by the flash irradiation from the flash lamps FL momentarily increases to a treatment temperature T2, and thereafter decreases rapidly.

After a predetermined time period has elapsed since the completion of the flash heating treatment, the halogen lamps HL turn off. This causes the temperature of the semiconductor wafer W to decrease rapidly from the preheating temperature T1. The lower radiation thermometer 20 measures the temperature of the semiconductor wafer W which is on the decrease. The result of measurement is transmitted to the controller 3. The controller 3 monitors whether the temperature of the semiconductor wafer W is decreased to a predetermined temperature or not, based on the result of measurement by means of the lower radiation thermometer 20. After the temperature of the semiconductor wafer W is decreased to the predetermined temperature or below, the pair of transfer arms 11 of the transfer mechanism 10 is moved horizontally again from the retracted position to the transfer operation position and is then moved upwardly, so that the lift pins 12 protrude from the upper surface of the susceptor 74 to receive the heat-treated semiconductor wafer W from the susceptor 74. Subsequently, the transport opening 66 which has been closed is opened by the gate valve 185, and the transport hand 151b (or the transport hand 151a) of the transport robot 150 transports the treated semiconductor wafer W placed on the lift pins 12 to the outside. Specifically, the transport robot 150 moves the transport hand 151b forward to a position lying immediately under the semiconductor wafer W thrust upwardly by the lift pins 12, and stops the transport hand 151b thereat. Then, the pair of transfer arms 11 moves downwardly, whereby the semiconductor wafer W subjected to the flash heating is transferred to and placed on the transport hand 151b. Thereafter, the transport robot 150 causes the transport hand 151b to move out of the treatment chamber 6, thereby transporting the heat-treated semiconductor wafer W to the transport chamber 170.

Next, the transport robot 150 transports the heat-treated semiconductor wafer W into the cool chamber 131 of the cooling part 130. The cooling part 130 cools the semiconductor wafer W at a relatively high temperature immediately after the heat treatment to near ordinary temperatures (Step S8). The process of cooling the semiconductor wafer W may be performed in the cool chamber 141 of the cooling part 140.

After the completion of the cooling process, the transfer robot 150 transports the cooled semiconductor wafer W from the cool chamber 131 into the film thickness measurement chamber 401. The film thickness measurement part 400 measures the thickness of a thin film formed on the front surface of the semiconductor wafer W transported into the film thickness measurement chamber 401. At this time, the film thickness measurement part 400 measures the film thickness of the semiconductor wafer W subjected to the heat treatment in the heat treatment part 160. In the case where the film deposition process is performed by the flash heating treatment in the heat treatment part 160, the thickness of the deposited thin film is calculated by subtracting the film thickness measured prior to the treatment from the film thickness measured after the treatment.

After the completion of the film thickness measurement after the treatment, the transport robot 150 transports the semiconductor wafer W from the film thickness measurement chamber 401 to the transport chamber 170. Then, the transport robot 150 transports the semiconductor wafer W into the warpage measurement chamber 291 of the warpage measurement part 290. The warpage measurement part 290 measures the warpage occurring in the semiconductor wafer W subjected to the heating treatment.

After the completion of the wafer warpage measurement, the transfer robot 120 takes the semiconductor wafer W out of the warpage measurement chamber 291. Then, the transfer robot 120 stores the semiconductor wafer W taken out of the warpage measurement chamber 291 into the original carrier C (Step S9). In this manner, the heat treatment of the single semiconductor wafer W is completed.

In the present preferred embodiment, the imaging parameter of the camera 322 is adjusted based on the reflectance of the back surface of the semiconductor wafer W measured in Step S3 by the reflectance measurement part 350. The imaging parameter suitable for the imaging of the bare wafers is set as a default in the camera 322. Variations in reflectance due to the deposition of various thin films on the back surface of the semiconductor wafer W preclude the camera 322 from capturing the clear image of flaws even when the flaws are present in the back surface. The adjustment of the imaging parameter of the camera 322 based on the reflectance of the back surface of the semiconductor wafer W as in the present preferred embodiment allows the camera 322 to appropriately image the back surface of the semiconductor wafer W in accordance with the reflectance even if the reflectance is varied due to the deposition of thin films on the back surface of the semiconductor wafer W. If there is a flaw in the back surface of the semiconductor wafer W, the camera 322 is able to capture the clear image of the flaw. As a result, this allows the flaw determination part 32 to detect the flaw in the back surface of the semiconductor wafer W with reliability even if a thin film is deposited on the back surface of the semiconductor wafer W.

A semiconductor wafer W having a flaw detected on the back surface thereof is returned to the carrier C without flash heating in the heat treatment part 160. This prevents cracking of the semiconductor wafer W having the flaw. As a result, the downtime of the apparatus resulting from wafer cracking is reduced, which in turn suppresses the reduction in productivity.

The adjustment of the imaging parameter of the camera 322 can be made even if a separately purpose-built apparatus is used to measure the reflectance of the back surface of the semiconductor wafer W as a process preceding the heat treatment apparatus 100. This, however, increases the number of steps of transporting the semiconductor wafer W to thereby reduce the productivity. In particular, there are cases in which the deposition state on back surfaces of semiconductor wafers W is not controlled, which in turn causes wafers in the same lot that undergo the same process to differ in deposition state. This requires all of the semiconductor wafers W to be transported to the purpose-built apparatus and subjected to the measurement of the back surface reflectance, resulting in significant reduction in productivity. In the present preferred embodiment, the provision of the reflectance measurement part 350 in the flaw detection chamber 301 eliminates the need for the wafer transport for the reflectance measurement to suppress the reduction in productivity. Also, the present preferred embodiment reduces the time (tact time) required for the processing of the semiconductor wafers W in the heat treatment apparatus 100 to improve throughput.

In the present preferred embodiment, the wavelength of the light directed from the light source 351 onto the back surface of the semiconductor wafer W when the reflectance measurement part 350 measures the reflectance is equal to the wavelength of light directed from the light source 321 onto the back surface of the semiconductor wafer W when the camera 322 performs the imaging. The reflectance measured by the reflectance measurement part 350 has wavelength dependence, and the reflectance of the back surface of the semiconductor wafer W measured by the reflectance measurement part 350 varies depending on the wavelength of the light directed from the light source 351. For this reason, if the wavelength of light directed onto the back surface of the semiconductor wafer W during the reflectance measurement differs from that during the imaging, the imaging parameter of the camera 322 cannot be appropriately adjusted. In the present preferred embodiment, the imaging parameter of the camera 322 is appropriately adjusted based on the measured reflectance of the back surface of the semiconductor wafer W because the wavelength of light directed onto the back surface of the semiconductor wafer W during the reflectance measurement is equal to the wavelength of light directed onto the back surface of the semiconductor wafer W during the imaging.

While the preferred embodiment according to the present invention has been described hereinabove, various modifications of the present invention in addition to those described above may be made without departing from the scope and spirit of the invention. For example, the reflectance measurement part 350 is provided in the flaw detection chamber 301 in the aforementioned preferred embodiment, but may be provided at any position along the transport path of the semiconductor wafer W from the carrier C to the flaw detection chamber 301. As an example, the reflectance measurement part 350 may be provided in the alignment chamber 231 of the alignment part 230. The provision of the reflectance measurement part 350 at any position along the transport path of the semiconductor wafer W from the carrier C to the flaw detection chamber 301 eliminates the need for dedicated wafer transport for the reflectance measurement to thereby suppress the reduction in productivity.

The light source 351 that irradiates the back surface of the semiconductor wafer W with light when the reflectance measurement part 350 measures the reflectance and the light source 321 that irradiates the back surface of the semiconductor wafer W with light when the camera 322 performs the imaging may be a common light source. Specifically, for example, a light source may be provided in one of the reflectance measurement part 350 and the imaging part 320, and light may be guided from the light source to the other part through an optical fiber to impinge upon the back surface of the semiconductor wafer W. This also causes the wavelength of light directed onto the back surface of the semiconductor wafer W during the reflectance measurement and the wavelength of light directed onto the back surface of the semiconductor wafer W during the imaging to be inevitably equal to each other. Thus, the imaging parameter of the camera 322 is appropriately adjusted based on the measured reflectance of the back surface of the semiconductor wafer W.

In the aforementioned preferred embodiment, the adjustment part 31 adjusts the exposure time of the camera 322, based on the reflectance of the back surface of the semiconductor wafer W. However, in place of or in addition to this, the adjustment part 31 may adjust the sensitivity of the camera 322. For the sensitivity of the camera 322, a table showing a correlation between the reflectance of the back surface of the semiconductor wafer W and the sensitivity, which is similar to the correlation table 35, may be created, and the sensitivity of the camera 322 may be adjusted in accordance with the table. In other words, the heat treatment apparatus 100 is required only to be configured such that the imaging parameter of the camera 322 is adjusted based on the reflectance of the back surface of the semiconductor wafer W.

In addition, a warning may be issued on the display part 37 when a flaw is detected in the back surface of the semiconductor wafer W in Step S6.

Although the 30 flash lamps FL are provided in the flash lamp house 5 in the aforementioned preferred embodiment, the present invention is not limited to this. Any number of flash lamps FL may be provided. The flash lamps FL are not limited to the xenon flash lamps, but may be krypton flash lamps. Also, the number of halogen lamps HL provided in the halogen lamp house 4 is not limited to 40. Any number of halogen lamps HL may be provided.

In the aforementioned preferred embodiment, the filament-type halogen lamps HL are used as continuous lighting lamps that emit light continuously for not less than one second to preheat the semiconductor wafer W. The present invention, however, is not limited to this. In place of the halogen lamps HL, discharge type arc lamps (e.g., xenon arc lamps) or LED lamps may be used as the continuous lighting lamps to perform the preheating.

While the invention has been shown and described in detail, the foregoing description is in all aspects illustrative and not restrictive. It is therefore understood that numerous modifications and variations can be devised without departing from the scope of the invention.

What is claimed is:

1. A heat treatment apparatus for irradiating a substrate with light to heat the substrate, comprising:
   a treatment chamber for performing heat treatment on said substrate;
   a light irradiation part for irradiating said substrate received in said treatment chamber with the light;
   a flaw detection chamber for detecting the presence or absence of a flaw in a back surface of said substrate;
   a camera for imaging the back surface of said substrate received in said flaw detection chamber to detect the presence or absence of a flaw;
   a reflectance measurement part for measuring the reflectance of the back surface of said substrate; and
   an adjustment part for adjusting an imaging parameter of said camera, based on the reflectance of the back surface of said substrate measured by said reflectance measurement part.

2. The heat treatment apparatus according to claim 1, further comprising
   a storage part for storing therein a correlation table showing a correlation between the reflectance of the back surface of said substrate and said imaging parameter,
   wherein said adjustment part adjusts said imaging parameter, based on said correlation table.

3. The heat treatment apparatus according to claim 2,
   wherein said imaging parameter includes exposure time, and
   wherein said adjustment part increases the exposure time of said camera as the reflectance of the back surface of said substrate decreases.

4. The heat treatment apparatus according to claim 1, wherein a wavelength of light impinging upon the back surface of said substrate when said reflectance measurement part measures the reflectance is equal to a wavelength of light impinging upon the back surface of said substrate when said camera performs the imaging.

5. The heat treatment apparatus according to claim 4, wherein a light source that irradiates the back surface of said substrate with light when said reflectance measurement part measures the reflectance and a light source that irradiates the back surface of said substrate with light when said camera performs the imaging are common.

6. The heat treatment apparatus according to claim 1, wherein said reflectance measurement part is provided in said flaw detection chamber.

7. The heat treatment apparatus according to claim 6, wherein said reflectance measurement part is provided in a path of transport of said substrate to said flaw detection chamber.

8. The heat treatment apparatus according to claim 1, wherein the heat treatment apparatus is configured to interrupt transporting said substrate from said flaw detection chamber to said treatment chamber when a flaw is detected.

\* \* \* \* \*